United States Patent
Zhu et al.

(10) Patent No.: US 11,964,995 B2
(45) Date of Patent: Apr. 23, 2024

(54) METHODS FOR MAKING LOW BANDGAP PEROVSKITES

(71) Applicants: Alliance for Sustainable Energy, LLC, Golden, CO (US); Brown University Technology Ventures Office, Providence, RI (US)

(72) Inventors: Kai Zhu, Littleton, CO (US); Jinhui Tong, Wuhan (CN); Yuanyuan Zhou, Hong Kong (HK); Nitin P. Padture, Providence, RI (US); Jue Gong, Chengdu (CN)

(73) Assignees: Alliance for Sustainable Energy, LLC, Golden, CO (US); Brown University, Providence, RI (US)

( * ) Notice: Subject to any disclaimer, the term of this patent is extended or adjusted under 35 U.S.C. 154(b) by 0 days.

(21) Appl. No.: 17/586,069

(22) Filed: Jan. 27, 2022

(65) Prior Publication Data

US 2022/0235076 A1 Jul. 28, 2022

Related U.S. Application Data

(60) Provisional application No. 63/142,953, filed on Jan. 28, 2021.

(51) Int. Cl.
*C07F 7/24* (2006.01)
*H10K 30/10* (2023.01)

(52) U.S. Cl.
CPC ............... *C07F 7/24* (2013.01); *H10K 30/10* (2023.02)

(58) Field of Classification Search
CPC .................................. C07F 7/24; H10K 30/10
See application file for complete search history.

(56) References Cited

FOREIGN PATENT DOCUMENTS

| EP | 3496173 A1 * | 6/2019 | ........... C07C 257/12 |
|---|---|---|---|
| WO | WO-2018026326 A1 * | 2/2018 | ............. C30B 29/54 |
| WO | 2020108626 A1 | 1/2020 | |

OTHER PUBLICATIONS

Zhou et al., "Highly Efficient and Stable GABr-Modified Ideal-Bandgap (1.35 eV) Sn/Pb Perovskite Solar Cells Achieve 20.63% Efficiency with a Record Small Voc Deficit of 0.33 V", Adv. Mater. 2020, 32, 1908107. (Year: 2020).*

Aftab, A. et al., Role of additives SnX2 (X=F, Cl) and anti-solvents on the microstructure of PV absorber FASnI3 films, Elsevier Materials Letters, vol. 275, 2020, 3 pages.

(Continued)

*Primary Examiner* — Tae-Sik Kang
(74) *Attorney, Agent, or Firm* — Michael A. McIntyre

(57) ABSTRACT

The present disclosure relates to a composition that includes a perovskite having a stoichiometry comprising $A_{1-x}FA_xSn_{1-y}B_y(I_{1-z}X_z)_3$, where A is a first cation, B is a second cation, X is a halide, and $0.5 \leq x \leq 0.9$, $0.5 \leq y \leq 0.9$, and $0 \leq z \leq 1$. In some embodiments of the present disclosure, A may include at least one of cesium, guanidinium, and/or methylammonium. In some embodiments of the present disclosure, X may include at least one of bromide and/or chloride. In some embodiments of the present disclosure, z may be equal to zero.

20 Claims, 44 Drawing Sheets

A

B

(56) References Cited

OTHER PUBLICATIONS

Chung, I. et al., "CsSnI3: Semiconductor or Metal? High Electrical Conductivity and Strong Near-Infrared Photoluminescence from a Single Material. High Hole Mobility and Phase Transitions," Journal of the American Chemical Society, vol. 134, 2012, 9 pages.

Eperon, G.E. et al., "Perovskite-perovskite tandem photovoltaics with optimized band gaps," Science, vol. 354, Issue 6314, Nov. 18, 2016, 5 pages.

Hao, F. et al., "Anomalous Band Gap Behavior in Mixed Sn and Pb Perovskites Enables Broadening of Absorption Spectrum in Solar Cells," Journal of the American Chemical Society, vol. 136, 2014, 6 pages.

Hu, M. et al., "Sub-1.4eV bandgap inorganic perovskite solar cells with long-term stability," Nature Communications, 2020, 10 pages.

Jeon, N-J et al., "Compositional engineering of perovskite materials for high-performance solar cells," Nature Letter, vol. 517, 2015, 14 pages.

Jiang, Q. et al., "Surface passivation of perovskite film for efficient solar cells," Nature Photonics, vol. 13, Jul. 2019, 10 pages.

Kim, M. et al., "Effects of cation size and concentration of cationic chlorides on the properties of formamidinium lead odide based perovskite solar cells," Sustainable Energy & Fuels, vol. 4, 2020, 11 pages.

Lin, N. et al., "Inorganic CsPb1-xSnxIBr2 for Efficient Wide-Bandgap Perovskite Solar cells," Advanced Energy Materials Communication, vol. 8, 2018, 8 pages.

Liu, X. et al., "Improved efficiency and stability of Pb—Sn binary perovskite solar cells by Cs substitution," Journal of Materials Chemistry A, vol. 4, 2016, 7 pages.

Ogami, Y. et al., "CH3NH3SNxPb(1-x)I3 Perovskite Solar Cells Covering up to 1060 nm," Journal of Physical Chemistry Letters, vol. 5, 2014, 8 pages.

Prasanna, R. et al., "Band Gap Tuning via Lattice Contraction and Octahedral Tilting in Perovskite Materials for Photovoltaics," vol. 139, 2017, 8 pages.

Sun, S. et al., "Factors Influencing the Mechanical Properties of Formamidinium Lead Halides and Related Hybrid Perovskites," ChemSusChem Communications, vol. 10, 2017, 6 pages.

Tai, Q. et al., "Antioxidant Grain Passivation for Air-Stable Tin-Based Perovskite Solar Cells," Angewandte Chemie, International Edition, vol. 58, 2019, 5 pages.

Tao, S. et al., "Absolute energy level positions in tin-and lead-based halide perovskites," Nature Communications, 2019, 10 pages.

Tong, J. et al., "Carrier lifetimes of >1 US in Sn—Pb perovskites enable efficient all-perovskite tandem solar cells," Science, vol. 364, May 3, 2019, 6 pages.

Turren-Cruz, S-H et al., "Methylammonium-free, high-performance, and stable perovskite solar cells on a planar architecture," Science, vol. 362, Oct. 26, 2018, 6 pages.

Wei, M. et al., "Combining Efficiency and Stability in Mixed Tin-Lead Perovskite Solar Cells by Capping Grains with an Ultrathin 2D layer," Advanced Materials Communication, vol. 32, 2020, 8 pages.

Yang, Z. et al., "Ideal Bandgap Organic-Inorganic Hybrid Perovskite Solar Cells," Advanced Materials Communication, vol. 29, 2017, 7 pages.

Yang, Z. et al., "Enhancing electron diffusion length in narrow-bandgap perovskites for efficient monolithic perovskite tandem solar cells," Nature Communications, 2019, 9 pages.

You, S. et al., "Long-term stable and highly efficient perovskite solar cells with a formamidinium chloride (FACl) additive," Journal of Materials Chemistry A, vol. 8, 2020, 9 pages.

Zhao, D. et al., "Efficient two-terminal all-perovskite tandem solar cells enabled by high-quality low-bandgap absorber layers," Nature Energy, vol. 3, Dec. 2018, 10 pages.

Zhao, J. et al., "Strained hybrid perovskite thin films and their impact on the intrinsic stability of perovskite solar cells," Science Advances, vol. 3, 2017, 8 pages.

Zong, Y. et al., "Homogenous Alloys of Formamidinium Lead Triiodide and Cesium Tin Triiodide for Efficient Ideal-Bandgap Perovskite Solar Cells," Communications, Angewandte Chemie, International Edition, vol. 56, 2017, 5 pages.

\* cited by examiner

US 11,964,995 B2

METHODS FOR MAKING LOW BANDGAP PEROVSKITES

CROSS-REFERENCE TO RELATED APPLICATIONS

This application claims priority from U.S. Provisional Patent Application No. 63/142,953 filed on Jan. 28, 2021, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Perovskite solar cells (PSCs) have emerged as a next generation photovoltaic (PV) technology, with the potential to displace many incumbent PV technologies in the future. The most efficient PSCs reported thus far are based on Pb-based halide perovskites, generally with bandgaps in a range between about 1.5 eV and about 1.7 eV. This bandgap range is substantially higher than that most suitable for single-junction solar cells, about 1.34 eV, according to the Shockley-Queisser (S-Q) calculation (~1.34 eV), as well as for the bottom cell in all-perovskite tandem devices to go beyond the S-Q limit. Thus, there remains a need for new, lower bandgap perovskite compositions, and methods of making them, which will help enable the manufacture of high efficiency, stable PSCs on the industrial scale.

SUMMARY

An aspect of the present disclosure is a composition that includes a perovskite having a stoichiometry comprising $A_{1-x}FA_xSn_{1-y}B_y(I_{1-z}X_z)_3$, where A is a first cation, B is a second cation, X is a halide, and $0.5 \leq x \leq 0.9$, $0.5 \leq y \leq 0.9$, and $0 \leq z \leq 1$. In some embodiments of the present disclosure, A may include at least one of cesium, guanidinium, and/or methylammonium. In some embodiments of the present disclosure, X may include at least one of bromide and/or chloride. In some embodiments of the present disclosure, z may be equal to zero.

In some embodiments of the present disclosure, the composition may be further characterized by a bandgap between about 1.1 eV and about 1.5 eV. In some embodiments of the present disclosure, the bandgap may be between about 1.3 eV and about 1.4 eV. In some embodiments of the present disclosure, the composition may be further characterized by at least one physical property having a characteristic value. In some embodiments of the present disclosure, the physical property may include a grain size with the characteristic value between about 300 nm and about 1500 nm. In some embodiments of the present disclosure, the grain size may be between about 750 nm and about 850 nm. In some embodiments of the present disclosure, the physical property may include a biaxial residual stress level with the characteristic value between about 0 MPa and about 100 MPa. In some embodiments of the present disclosure, the biaxial residual stress level may be between about 0 MPa and about 40 MPa. In some embodiments of the present disclosure, the physical property may include a dark carrier density with the characteristic value between about $1\times10^{13}$ cm$^{-3}$ and about $1\times10^{17}$ cm$^{-3}$. In some embodiments of the present disclosure, the dark carrier density may be between about $5\times10^{14}$ cm$^{-3}$ and about $5\times10^{16}$ cm$^{-3}$. In some embodiments of the present disclosure, the composition may include $Cs_{1-x}FA_xSn_{1-y}Pb_yI_3$. In some embodiments of the present disclosure, $0.6 \leq x \leq 0.8$ and $0.6 \leq y \leq 0.8$.

An aspect of the present disclosure is a method of making a perovskite, where the method includes combining a stoichiometric amount of at least one perovskite precursor that includes formamidinium (FA), tin, iodide, A, B, and X resulting in a mixture, adding an additive to the mixture, and treating the mixture. Further, the treating results in the forming of the perovskite having a stoichiometry comprising $A_{1-x}FA_xSn_{1-y}B_y(I_{1-z}X_z)_3$, where A is a first cation, B is a second cation, X is a halide, $0 \leq x \leq 1$, $0 \leq y \leq 1$, $0 \leq z \leq 1$, and the additive includes FA and tin and at least one of fluoride and/or chloride.

In some embodiments of the present disclosure, the additive is added at a concentration between about 0.1 mol % and about 10 mol % relative to the stoichiometric amount. In some embodiments of the present disclosure, the concentration may be between about 0.1 mol % and about 5 mol %. In some embodiments of the present disclosure, the additive may include at least one of $SnF_2 \cdot xFACl$ or $SnCl_2 \cdot xFACl$, where $1.5 \leq x \leq 4.5$. In some embodiments of the present disclosure, $2.5 \leq x \leq 3.5$.

BRIEF DESCRIPTION OF DRAWINGS

Some embodiments are illustrated in referenced figures of the drawings. It is intended that the embodiments and figures disclosed herein are to be considered illustrative rather than limiting.

DETAILED DESCRIPTION

Figure 1A:
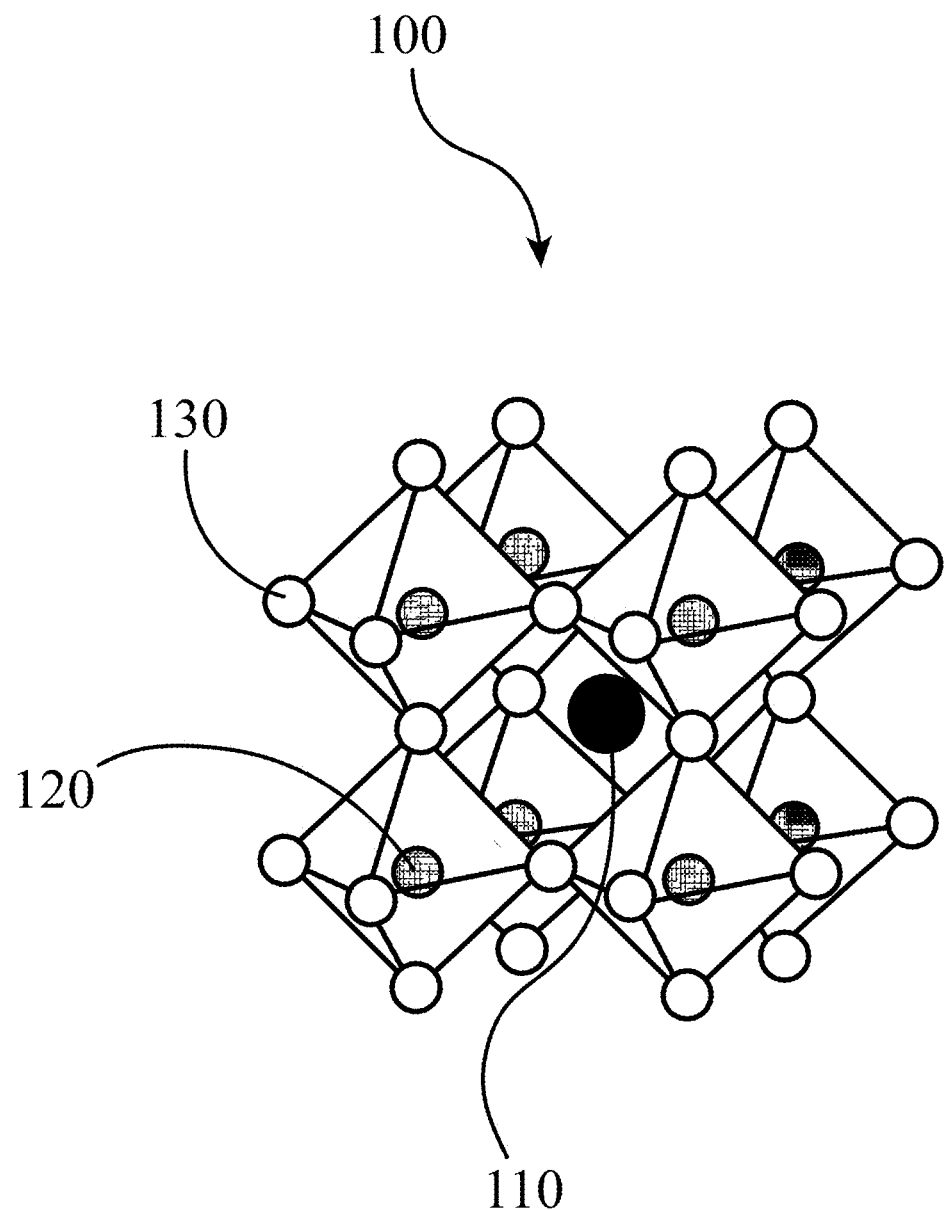
FIGS. 1A, 1B, and 1C illustrate a perovskite, according to some embodiments of the present disclosure.

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

Among other things, the present disclosure relates to the use of one or more additives during the formation of a perovskite, resulting in improved final physical properties and/or performance metrics of the finally formed perovskite. In addition to the improved quality of the finally formed perovskite, for the example of a film of perovskite, the residual stresses in films appear to play an important role in influencing both the stability and efficiency of perovskite solar cells (PSCs) incorporating the perovskite films. For example, as described herein, a novel tin (Sn)-halide-complex (SHC) additive, SnCl$_2$·xFACl (where x is optimized to about 3 at a 5 mol % addition relative to the amount of SnI$_2$ provided in the formulation used to make the target perovskite composition), the residual stress was effectively reduced in an exemplary MA-free, Cs-FA-based Sn—Pb halide perovskite film of composition (FAPbI$_3$)$_{0.7}$ (CsSnI$_3$)$_{0.3}$ (or Cs$_{0.3}$FA$_{0.7}$Sn$_{0.3}$Pb$_{0.7}$I$_3$) having a bandgap ~1.34 eV (FA is formamidinium). As shown herein, it was determined that the SnCl$_2$·3FACl additive enables the formation of a high-quality perovskite-substrate interface during room-temperature solution processing. The use of this exemplary additive also reduced the defect density by two orders of magnitude compared to identical perovskite synthesis in the absence of the additive (referred to herein as a "pristine" perovskite) and it further improved the structural and optoelectronic properties of the thin perovskite films. Using this approach, the power-conversion efficiency (PCE) values of the resulting PSCs approached nearly 20%, which to date, is the highest for MA-free Sn—Pb-based PSCs having a bandgap in the range of about 1.34 eV. In addition, a promising operational stability was demonstrated with greater than 80% of the initial PCE maintained after 750 hours under continuous operation at about 45° C. with maximum-power-point tracking under 1-sun illumination.

Figure 1B:
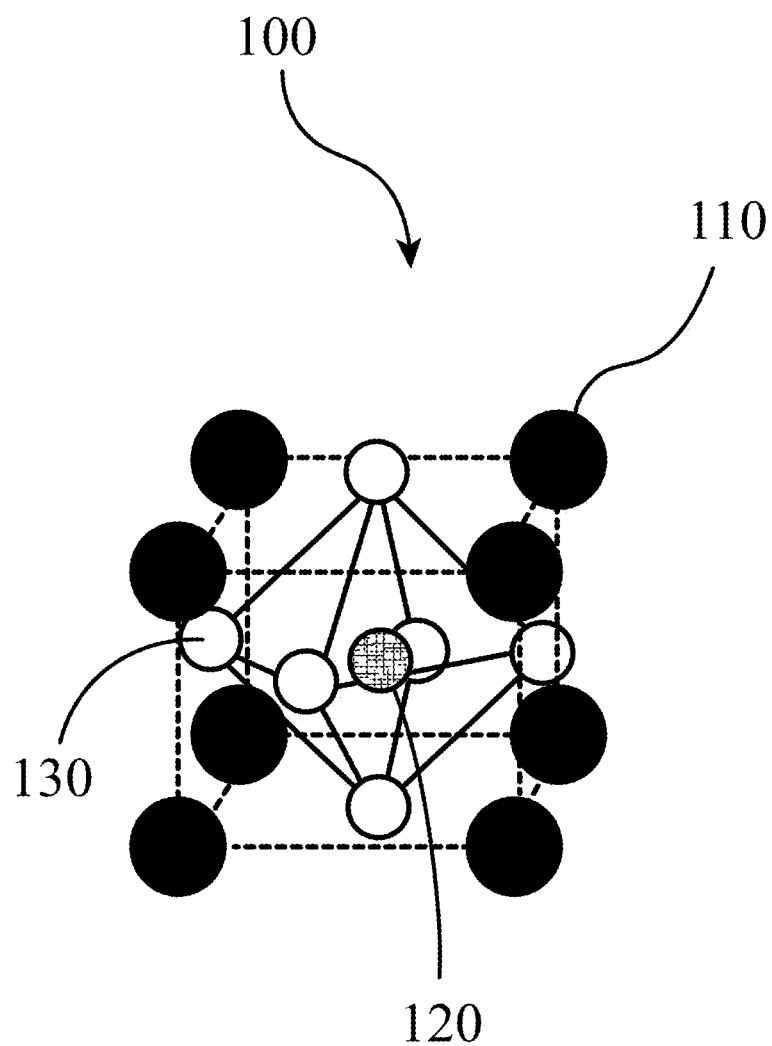
Figure 1C:
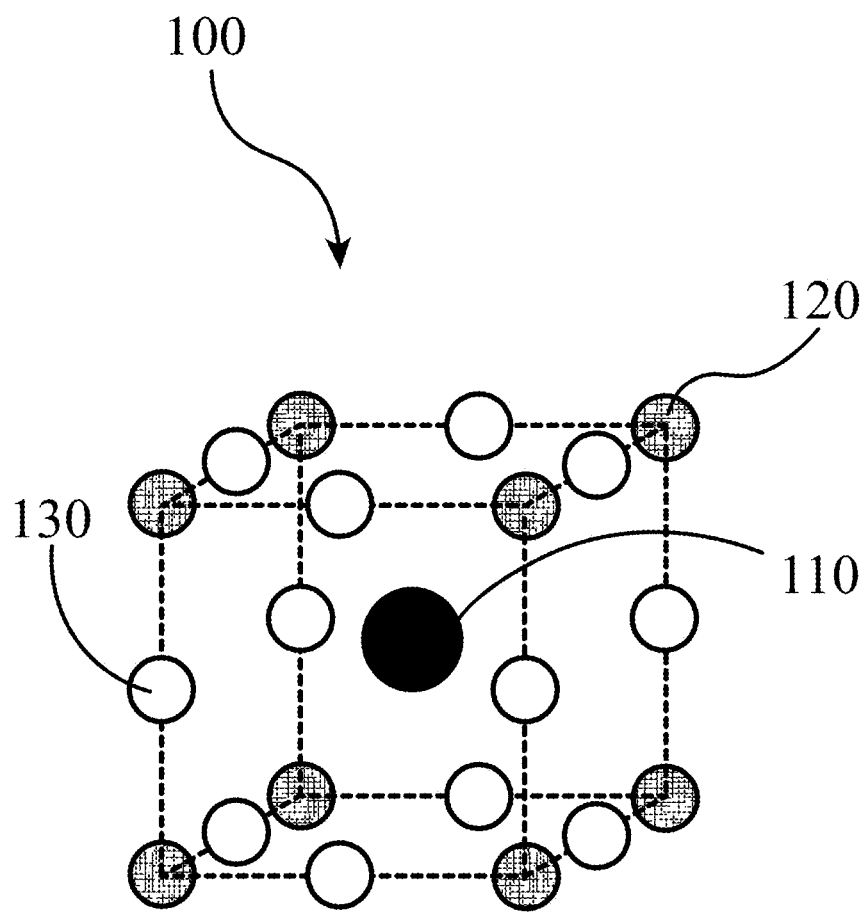

FIGS. 1A, 1B, and 1C illustrate that perovskites 100, for example halide perovskites, may organize into cubic crystalline structures with corner-sharing octahedra, as well as other crystalline structures such as tetragonal, hexagonal, and orthorhombic with either edge- or face-sharing octahedra, and may be described by the general formula $ABX_3$, where X (130) is an anion and A (110) and B (120) are cations, typically of different sizes. In some embodiments of the present disclosure, a perovskite may have a layered structure that includes 3D structures described above positioned between sheets of organic cations; these are often termed 2D perovskites. Mixture of the 2D and 3D phases are also possible. FIG. 1A illustrates that a perovskite 100 may be organized into eight octahedra surrounding a central A-cation 110, where each octahedra is formed by six X-anions 130 surrounding a central B-cation 120. FIG. 1B illustrates that a perovskite 100 may be visualized as a cubic unit cell, where the B-cation 120 is positioned at the center of the cube, an A-cation 110 is positioned at each corner of the cube, and an X-anion 130 is face-centered on each face of the cube. FIG. 1C illustrates that a perovskite 100 may also be visualized as a cubic unit cell, where the B-cation 120 resides at the eight corners of a cube, while the A-cation 110 is located at the center of the cube and with 12 X-anions 130 centrally located between B-cations 120 along each edge of the unit cell. For both unit cells illustrated in FIGS. 1B and 1C, the A-cations 110, the B-cations 120, and the X-anions 130 balance to the general formula $ABX_3$, after accounting for the fractions of each atom shared with neighboring unit cells. For example, referring to FIG. 1B, the single B-cation 120 atom is not shared with any of the neighboring unit cells. However, each of the six X-anions 130 is shared between two unit cells, and each of the eight A-cations 110 is shared between eight unit cells. So, for the unit cell shown in FIG. 1B, the stoichiometry simplifies to B=1, A=8*0.125=1, and X=6*0.5=3, or $ABX_3$. Similarly, referring again to FIG. 1C, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to FIG. 1C, the X-anions 130 and the B-cations 120 are shown as aligned along an axis; e.g., where the angle at the X-anion 130 between two neighboring B-cations 120 is exactly 180 degrees, referred to herein as the tilt angle. However, a perovskite 100 may have a tilt angle not equal to 180 degrees. For example, some embodiments of the present disclosure may have a tilt angle between 153 and 180 degrees.

Typical inorganic perovskites include calcium titanium oxide (calcium titanate) minerals such as, for example, $CaTiO_3$ and $SrTiO_3$. In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), hydrazinium, acetylammonium, dimethylammonium, imidazolium, guanidinium, benzylammonium, phenethylammonium, butylammonium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g., fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g., x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens (e.g., at least one of I, Br, Cl, and/or F), thiocyanate, and/or sulfur. Any combination is possible provided that the charges balance.

For example, a perovskite having the basic crystal structure illustrated in FIGS. 1A-1C, in at least one of a cubic, orthorhombic, and/or tetragonal structure, may have other compositions resulting from the combination of the cations having various valence states in addition to the 2+ state and/or 1+ state described above for lead and alkyl ammonium cations; e.g., compositions other than $AB^{2+}X_3$ (where A is one or more cations, or for a mixed perovskite where A is two or more cations). Thus, the methods described herein may be utilized to create novel mixed cation materials having the composition of a double perovskite, $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Figure 2:
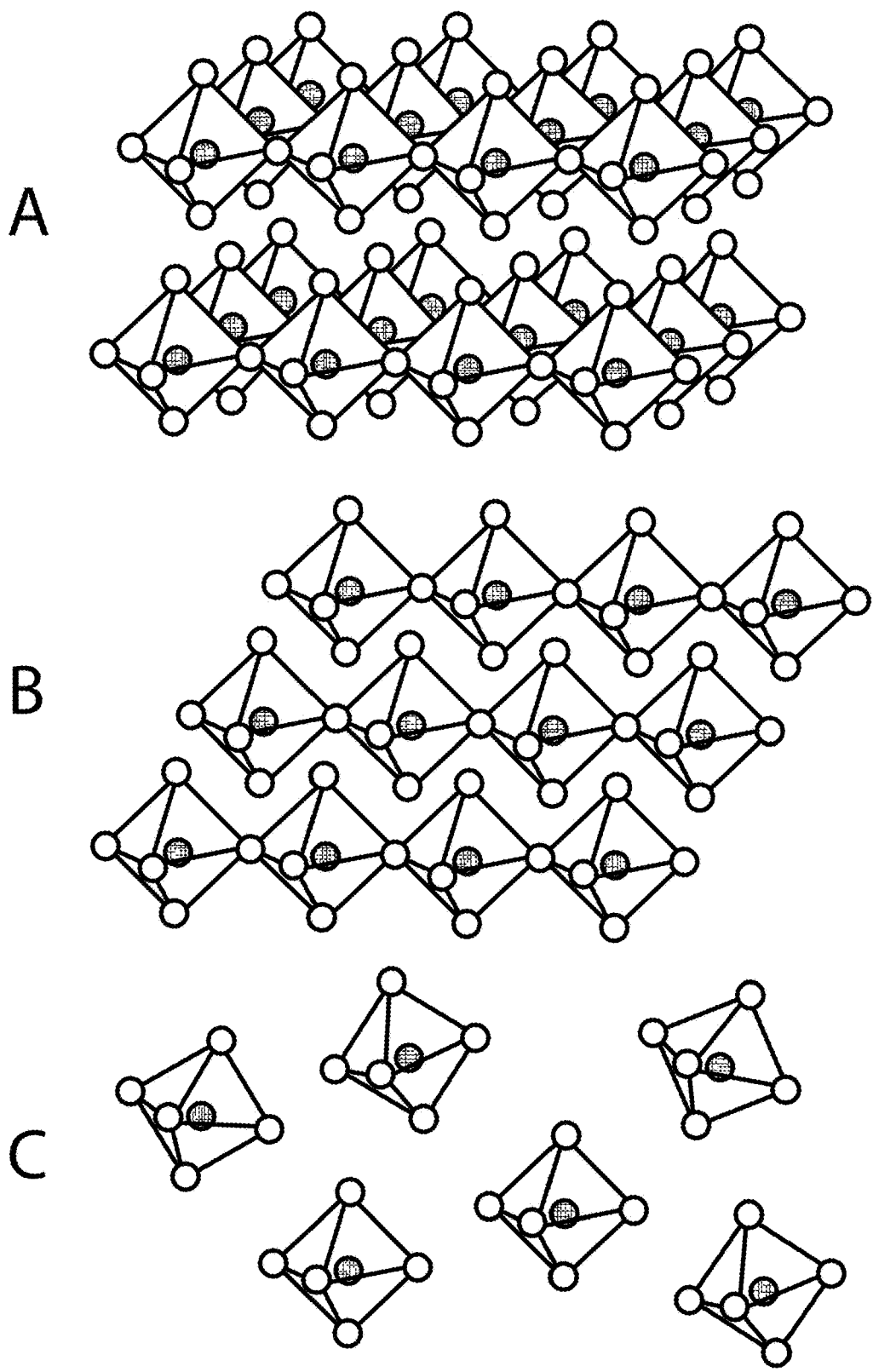
FIG. 2 illustrates 2D, 1D, and 0D perovskite structures, in Panels A, B, and C, respectively, according to some embodiments of the present disclosure.

In addition, perovskite halides, like other organic-inorganic perovskites, can form a three-dimensional (3D) network, a two-dimensional (2D) network, a one-dimensional (1D) network and/or a zero-dimensional (0D) network, possessing the same unit structure. A perovskite's 3D network is illustrated in FIGS. 1A, 1B, and 1C. FIG. 2 illustrates a 2D perovskite network, a 1D perovskite network, and a 0D perovskite network, in Panels A, B, and C, respectively. As described above, a 3D perovskite may adopt a general chemical formula of $ABX_3$, in which the A-cation may be a monovalent cation (e.g., methylammonium and/or formamidinium $CH(NH_2)_2^+$), the B-cation may be a divalent cation (e.g., $Pb^{2+}$ and/or $Sn^{2+}$), and the X-anion may be a halide anion ($I^-$, $Br^-$, and/or $Cl^-$). In this formula, the 3D network of perovskites may be constructed by linking all corner sharing $BX_6$ octahedra, with the A-cation filling the space between eight octahedral unit cells to balance the crystal charge.

Referring to Panel A of FIG. 2, through the chemically accomplished dimensional reduction of the 3D crystal lattice, 2D perovskites, $(A')_m(A)_{n-1}B_nX_{3n+1}$, may adopt a new structural and compositional dimension, A' (not shown), where monovalent (m=2) or divalent (m=1) cations can intercalate between the X-anions of the 2D perovskite sheets. Referring to Panel B of FIG. 2, 1D perovskites are constructed by $BX_6$ octahedral chained segments spatially isolated from each other by surrounding bulky organic cations (not shown), leading to bulk assemblies of paralleled octahedral chains. Referring to Panel C of FIG. 2, typically, the 0D perovskites are constructed of isolated inorganic octahedral clusters and surrounded by small cations (not shown) which are connected via hydrogen bonding.

Figure 3A:
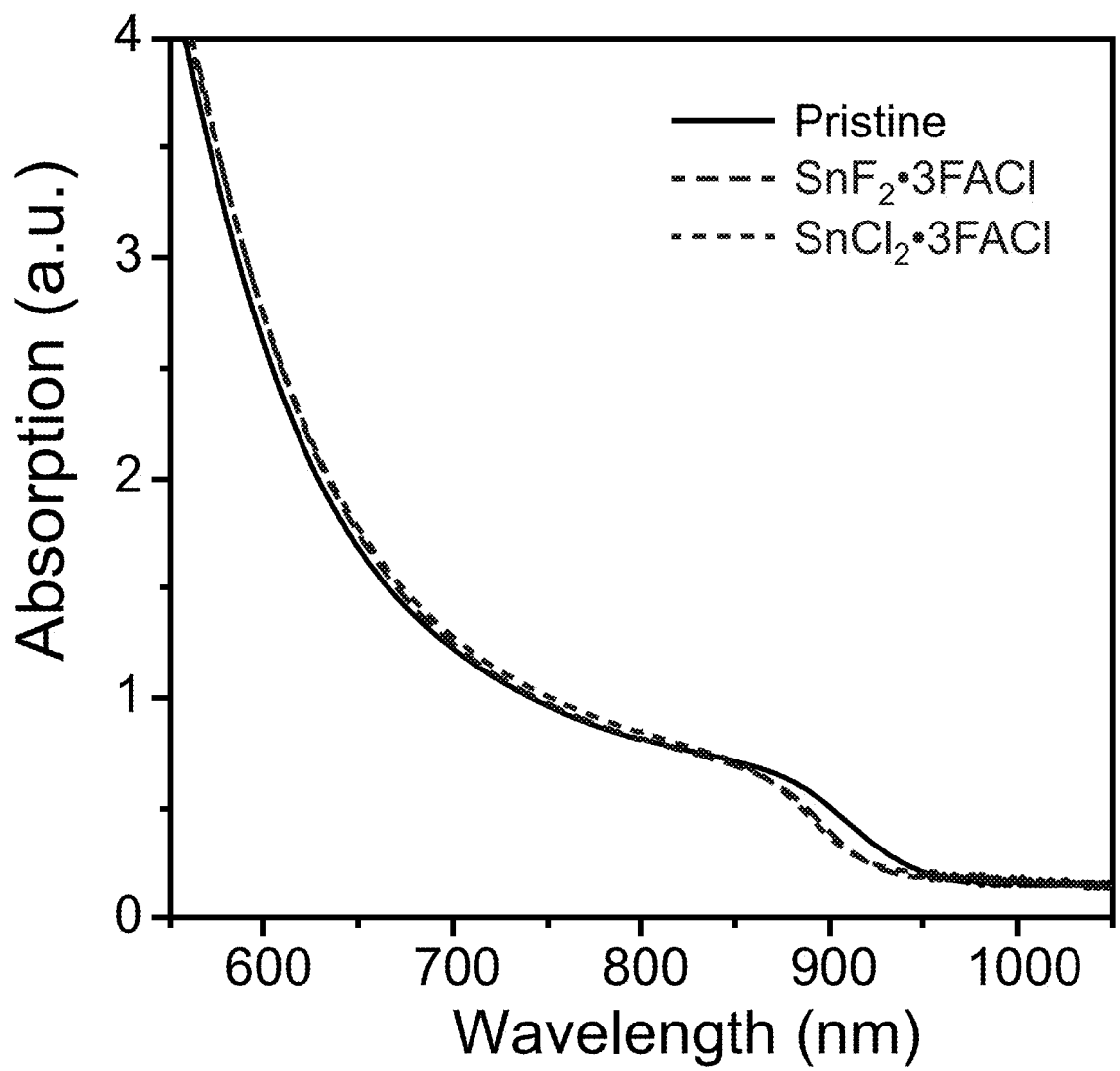
FIG. 3A illustrates UV-vis absorption spectra of $Cs_{0.3}FA_{0.7}Sn_{0.3}Pb_{0.7}I_3$ perovskite thin films prepared with and without additives (5 mol %) as indicated, according to some embodiments of the present disclosure.
Figure 3B:
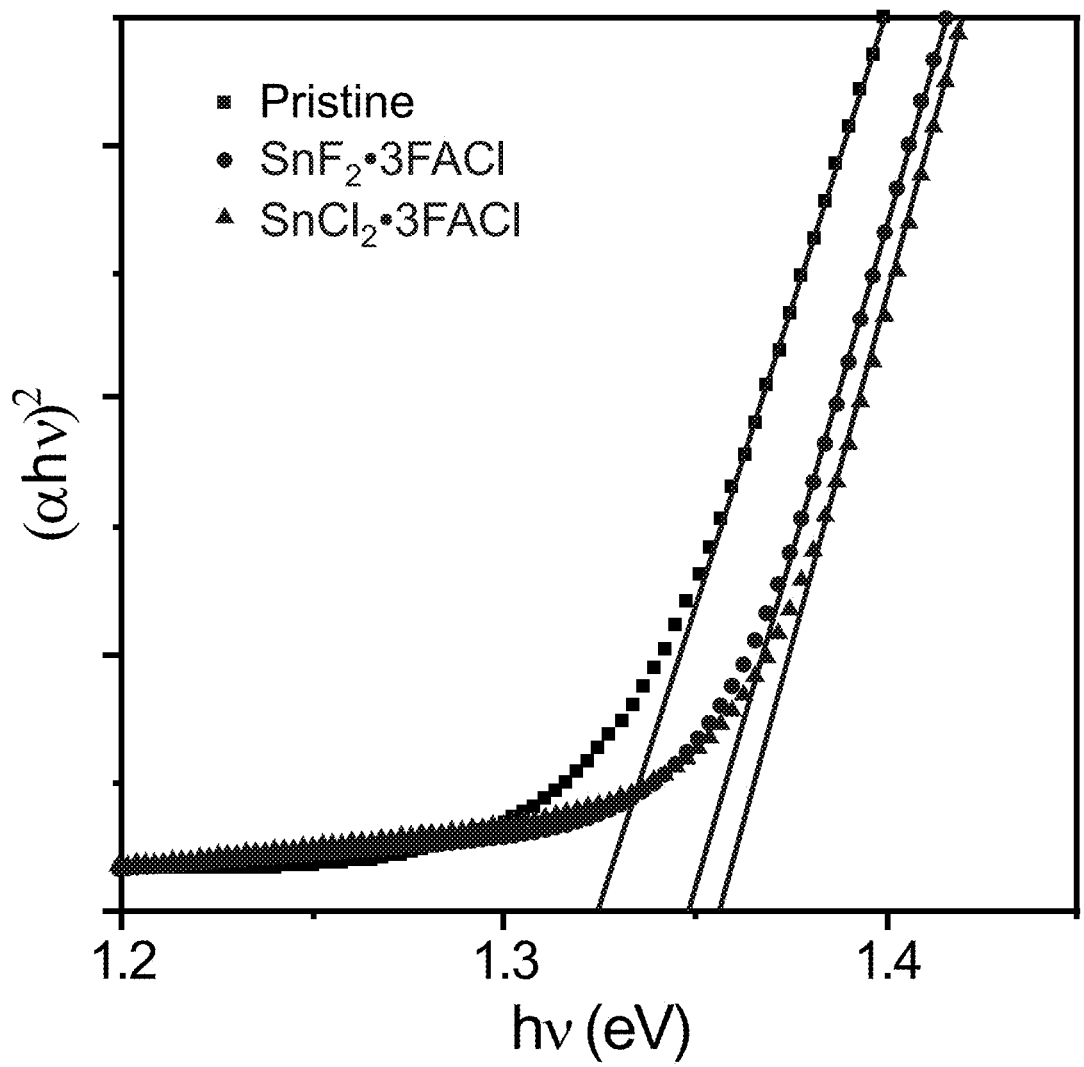
FIG. 3B illustrates the Tauc plots corresponding to the UV-vis absorption spectra illustrated in FIG. 3B of $Cs_{0.3}FA_{0.7}Sn_{0.3}Pb_{0.7}I_3$ perovskite thin films prepared with and without additives (5 mol %) as indicated, according to some embodiments of the present disclosure.
Figure 4:
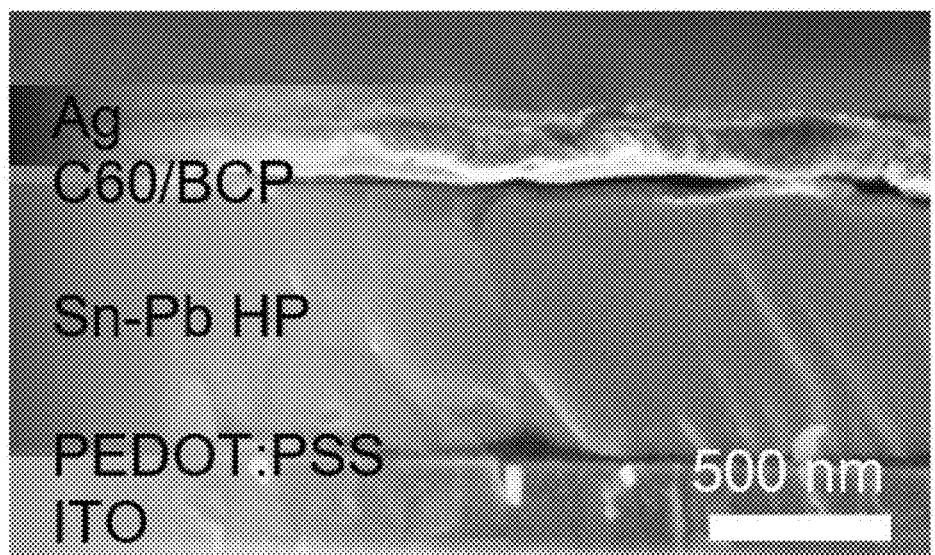
FIG. 4 illustrates a cross-sectional SEM image of a $Cs_{0.3}FA_{0.7}Sn_{0.3}Pb_{0.7}I_3$ perovskite solar cell made with $SnCl_2 \cdot 3FACl$ additive (5 mol %), according to some embodiments of the present disclosure.

Sn—Pb PSCs with $SnCl_2 \cdot 3FACl$ additive. An exemplary MA-free perovskite composition of $Cs_{0.3}FA_{0.7}Sn_{0.3}Pb_{0.7}I_3$ was chosen, partially for its favorable bandgap of about 1.34 eV (see FIGS. 3A and 3B) and to avoid the possible deleterious effect of $MA^+$ volatility, which may limit the long-term operational stability of PSCs. A new method was utilized for fabricating perovskite films in the presence of $SnCl_2 \cdot 3FACl$. Briefly, a stoichiometric perovskite precursor solution with about 5 mol % excess $SnCl_2 \cdot 3FACl$ additive was spin-coated, followed by thermal annealing. The exemplary PSC device stacks tested were prepared with an "inverted" device structure comprising glass/ITO/PEDOT: PSS/perovskite/C60/BCP/Ag, which corresponds to substrate/current collector/hole transport layer (PEDOT:PSS)/active layer/electron transport layer (C60/BCP)/current collector. The cross-sectional SEM image of this exemplary device stack is shown in FIG. 4. Note: An additive's molar ratio was calculated relative to the amount of $SnI_2$ molar amounts in a given recipe. For example, 5 mol % of SnCl2-3FACl additive means 5% of excess Sn and 15% of excess FA relative to $SnI_2$ used in this precursor. The 0.3 of Sn in $Cs_{0.3}FA_{0.7}Sn_{0.3}Pb_{0.7}I_3$ was based on the amount of $SnI_2$. The amount of additive was not considered in the stoichiometry calculation. "Stoichiometric" and "stoichiometric amount" refers to adding the specific molar amounts/ratios to attain the desired final perovskite composition. For example, to obtain $Cs_{0.3}FA_{0.7}Sn_{0.3}Pb_{0.7}I_3$, one would mix 0.3 moles of Cs, 0.7 moles of FA, 0.3 moles of tin, 0.7 moles of lead, and three moles of iodine.

Figure 5A:
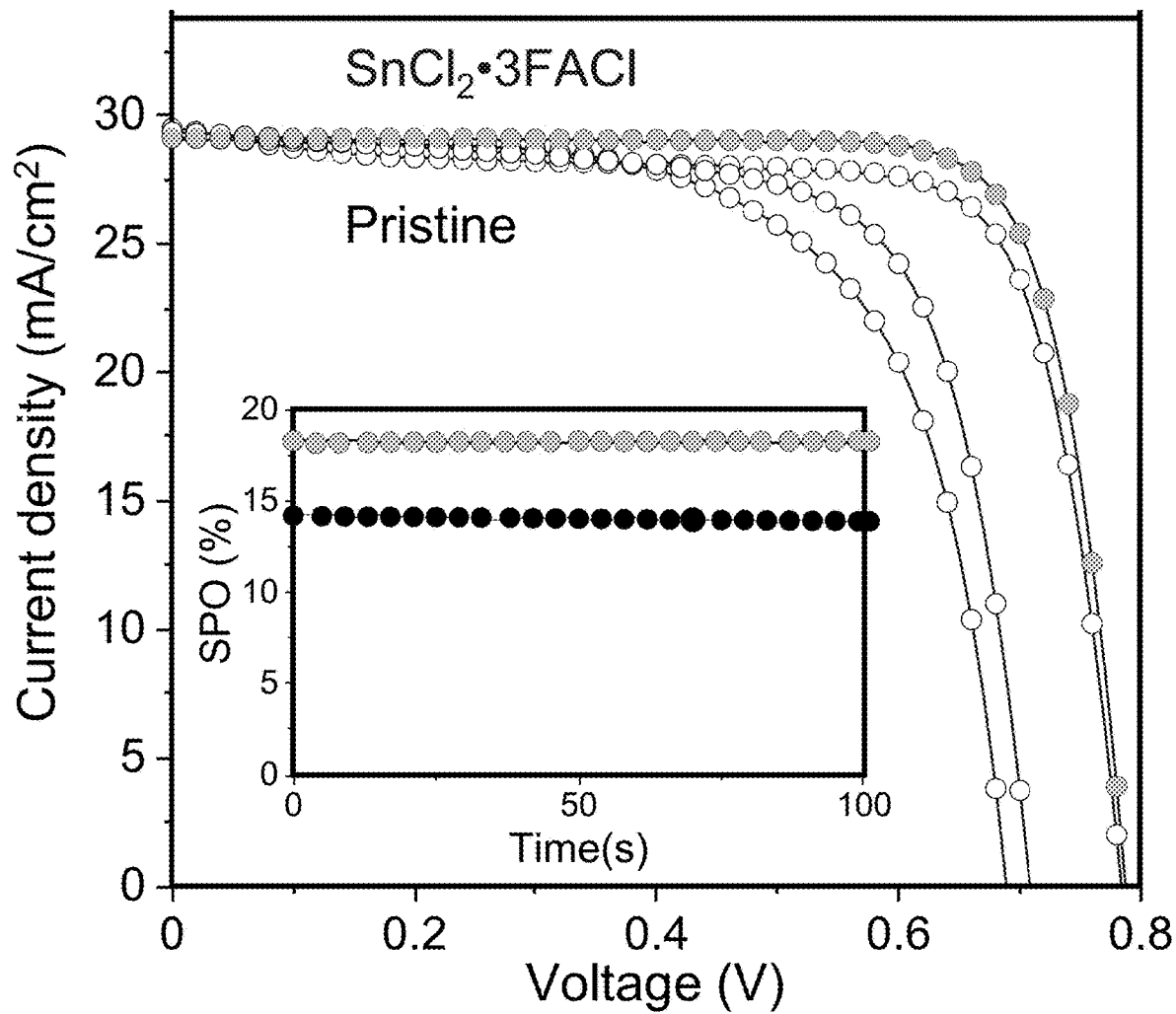
FIG. 5A illustrates a comparison of typical J-V curves under 1-sun illumination for PSCs based on $Cs_{0.3}FA_{0.7}Sn_{0.3}Pb_{0.7}I_3$ thin films made with $SnCl_2 \cdot 3FACl$ additive (5 mol %) and without (pristine) with both reverse scan (black symbols) and forward scan (lighter symbols), according to some embodiments of the present disclosure. Inset: SPO efficiencies.
Figure 5B:
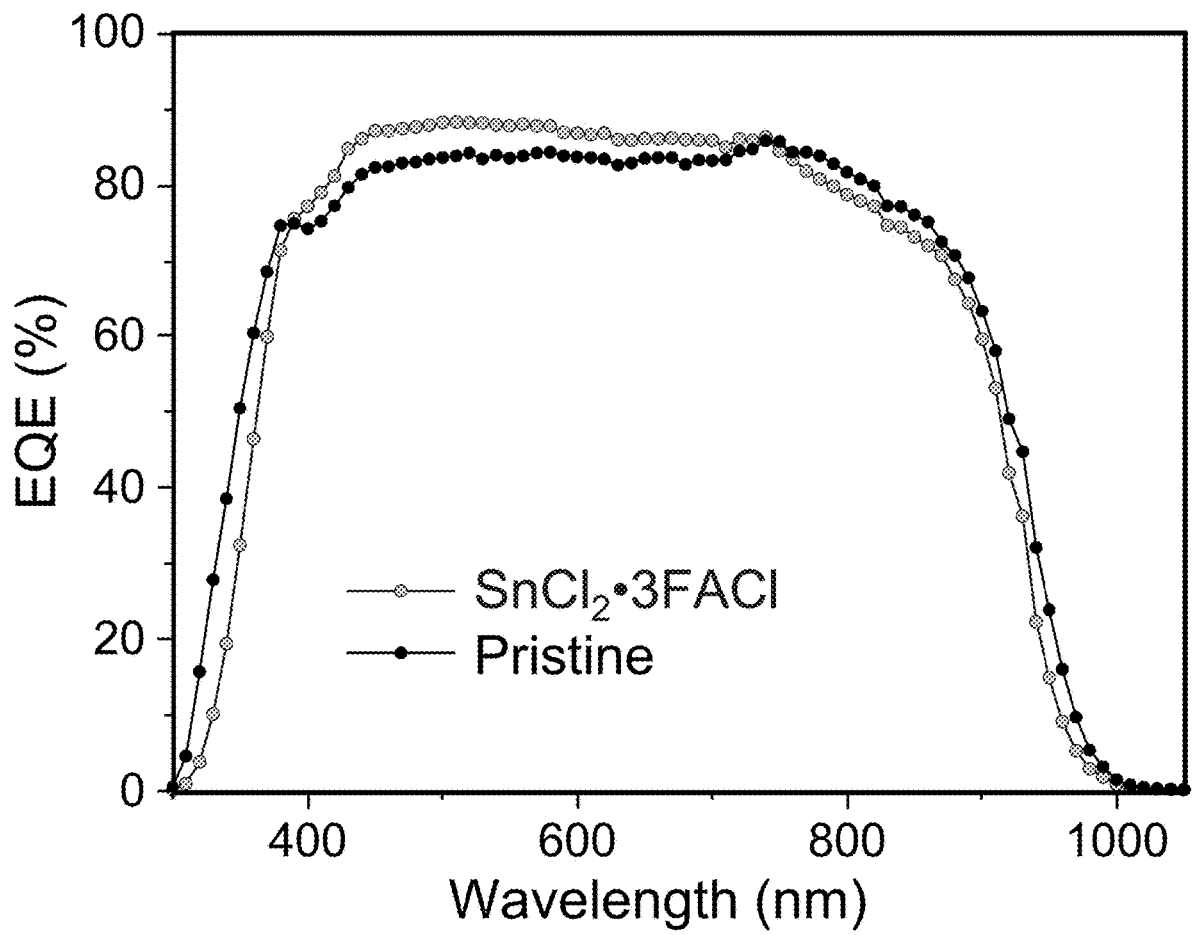
FIG. 5B illustrates a comparison of the corresponding EQE spectra for PSCs based on $Cs_{0.3}FA_{0.7}Sn_{0.3}Pb_{0.7}I_3$ thin films made with $SnCl_2 \cdot 3FACl$ additive (5 mol %) and without (pristine) with both reverse scan (black symbols) and forward scan (lighter symbols), according to some embodiments of the present disclosure.
Figure 5C:
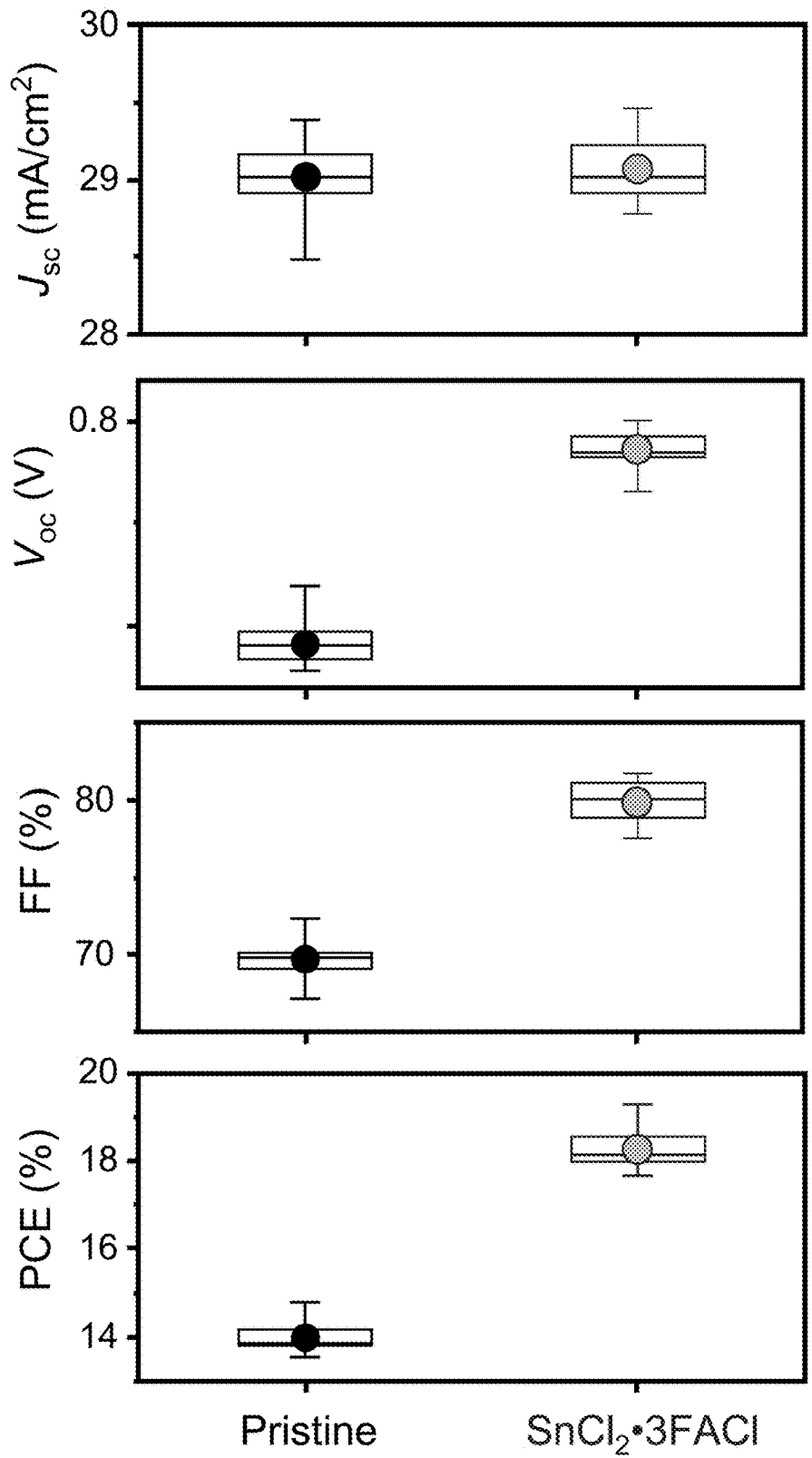
FIG. 5C illustrates a comparison of PV-parameter statistics for PSCs made with $SnCl_2 \cdot 3FACl$ additive (5 mol %) and without (pristine), according to some embodiments of the present disclosure.

The typical current density-voltage (J-V) curves, and the corresponding external quantum efficiency (EQE) spectra, for PSCs made with and without the $SnCl_2 \cdot 3FACl$ additive are shown in FIGS. 5A and 5B, respectively. The PSC made with $SnCl_2 \cdot 3FACl$ additive shows a reverse-scan PCE of 18.3% with a short-circuit current density ($J_{SC}$) of 29.1 mA/cm$^2$, an open-circuit voltage ($V_{OC}$) of 0.787 V, and a fill factor (FF) of 79.9%. The forward scan of the same device shows a PCE of 17.6% and the stabilized power output (SPO; see FIG. 5A, inset) efficiency is 18.3%. For comparison, the PSC without the $SnCl_2 \cdot 3FACl$ additive shows a PCE of 14.7% for reverse scan, 13.1% for forward scan, and SPO efficiency of 14.2%. The detailed device parameters are given in Table 1. The significant improvement in device performance can be attributed largely to the higher $V_{OC}$ and FF. All these observations are statistically reproducible based on PV parameters from 20 devices for each device condition (see FIG. 5C). There is a negligible impact of the additive on $J_{SC}$, which is consistent with the device EQE spectra (see FIG. 5B) and the optical absorption results (see FIGS. 3A and 3B). The slight increase of the bandgap achieved with the use of the $SnCl_2 \cdot 3FACl$ additive is consistent with the blue shift of the onset of the EQE spectrum on the long wavelength side. However, there is also a slight change of the EQE spectra in the shorter wavelength range. These changes are relatively small with opposite effects, leading to comparable $J_{SC}$ values in the two devices.

TABLE 1

J-V parameters of perovskite solar cells based on $Cs_{0.3}FA_{0.7}Sn_{0.3}Pb_{0.7}I_3$ perovskite films made without additives (pristine), with $SnCl_2 \bullet 3FACl$ (5 mol %), and with $SnF_2 \bullet 3FACl$ (5 mol %) additives.

| Device | | $J_{sc}$ (mA/cm$^2$) | $V_{oc}$ (V) | FF (%) | PCE (%) | SPO (%) |
|---|---|---|---|---|---|---|
| Pristine | Reverse | 29.4 | 0.706 | 70.6 | 14.7 | 14.2 |
| | Forward | 29.1 | 0.689 | 65.2 | 13.1 | |
| $SnF_2 \bullet 3FACl$ | Reverse | 29.1 | 0.765 | 76.8 | 17.1 | 16.6 |
| | Forward | 29.5 | 0.756 | 68.4 | 15.3 | |
| $SnCl_2 \bullet 3FACl$ | Reverse | 29.1 | 0.787 | 79.9 | 18.3 | 18.3 |
| | Forward | 29.5 | 0.784 | 75.9 | 17.6 | |

Figure 6:
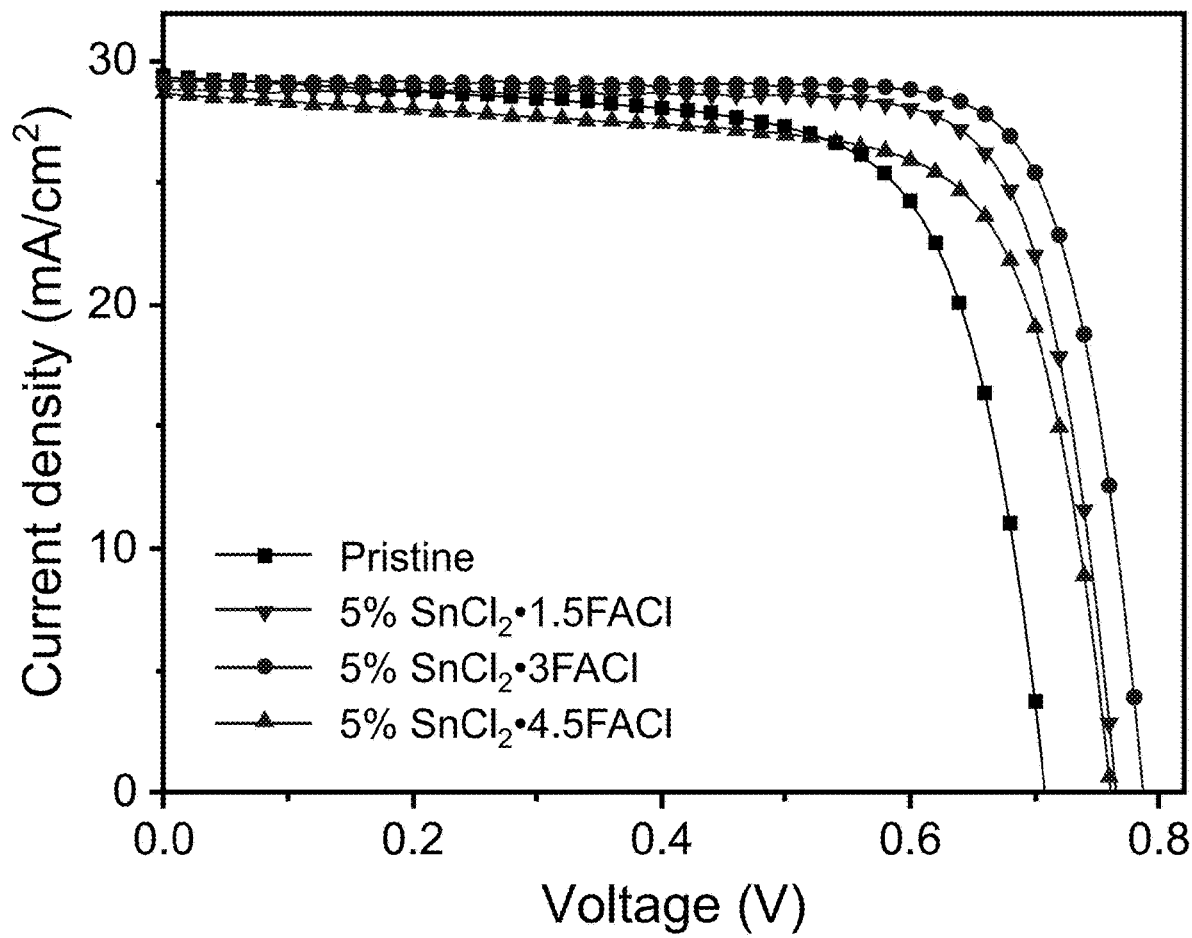
FIG. 6 illustrates J-V curves of $Cs_{0.3}FA_{0.7}Sn_{0.3}Pb_{0.7}I_3$ perovskite solar cells made without (pristine) and with 5 mol % $SnCl_2 \cdot xFACl$ additive (x=1.5, 3, and 4.5), according to some embodiments of the present disclosure. The $SnCl_2 \cdot 3FACl$ and pristine devices are the same as shown in FIGS. 5A and 5B, respectively. The $SnCl_2 \cdot 1.5FACl$ device shows a PCE of 17.3% with a $J_{sc}$ of 28.8 mA/cm$^2$, $V_{oc}$ of 0.765 V, and FF of 78.3%. The $SnCl_2 \cdot 4.5FACl$ device shows a PCE of 15.8% with a $J_{sc}$ of 28.6 mA/cm$^2$, $V_{oc}$ of 0.761 V, and FF of 72.7%.
Figure 7:
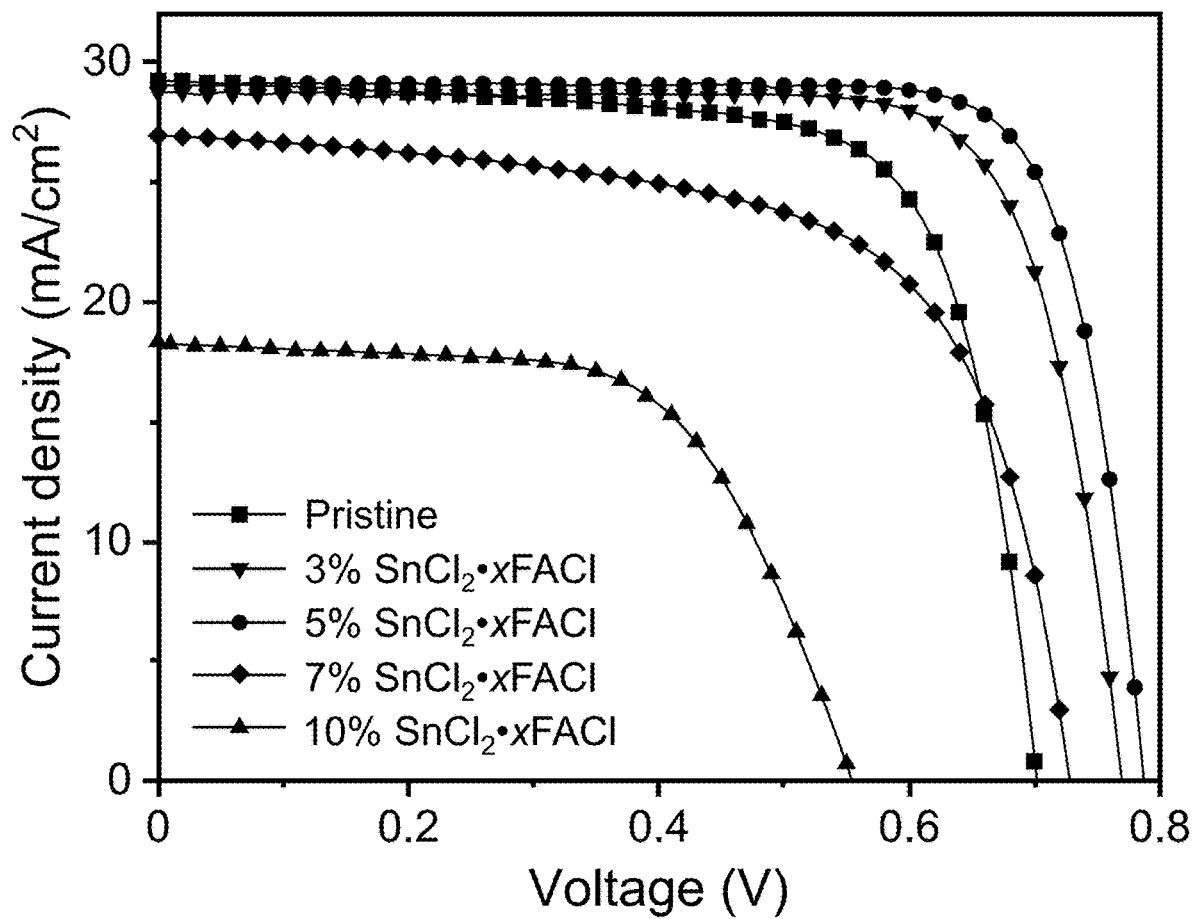
FIG. 7 illustrates J-V curves of $Cs_{0.3}FA_{0.7}Sn_{0.3}Pb_{0.7}I_3$ perovskite solar cells made without (pristine) and with $SnCl_2 \cdot 3FACl$ with different concentrations as indicated, according to some embodiments of the present disclosure. The 5%-$SnCl_2 \cdot 3FACl$ and pristine devices are the same as shown in FIG. 5A. The 3%-$SnCl_2 \cdot 3FACl$ device shows a PCE of 17.15% with a $J_{sc}$ of 28.7 mA/cm$^2$, $V_{oc}$ of 0.770V, and FF of 77.6%. The 7%-$SnCl_2 \cdot 3FACl$ device shows a PCE of 12.51% with a $J_{sc}$ of 26.9 mA/cm$^2$, $V_{oc}$ of 0.728V, and FF of 63.9%. The 10%-$SnCl_2 \cdot 3FACl$ device shows a PCE of 6.34% with a $J_{sc}$ of 18.3 mA/cm$^2$, $V_{oc}$ of 0.554V, and FF of 62.5%.
Figure 8:
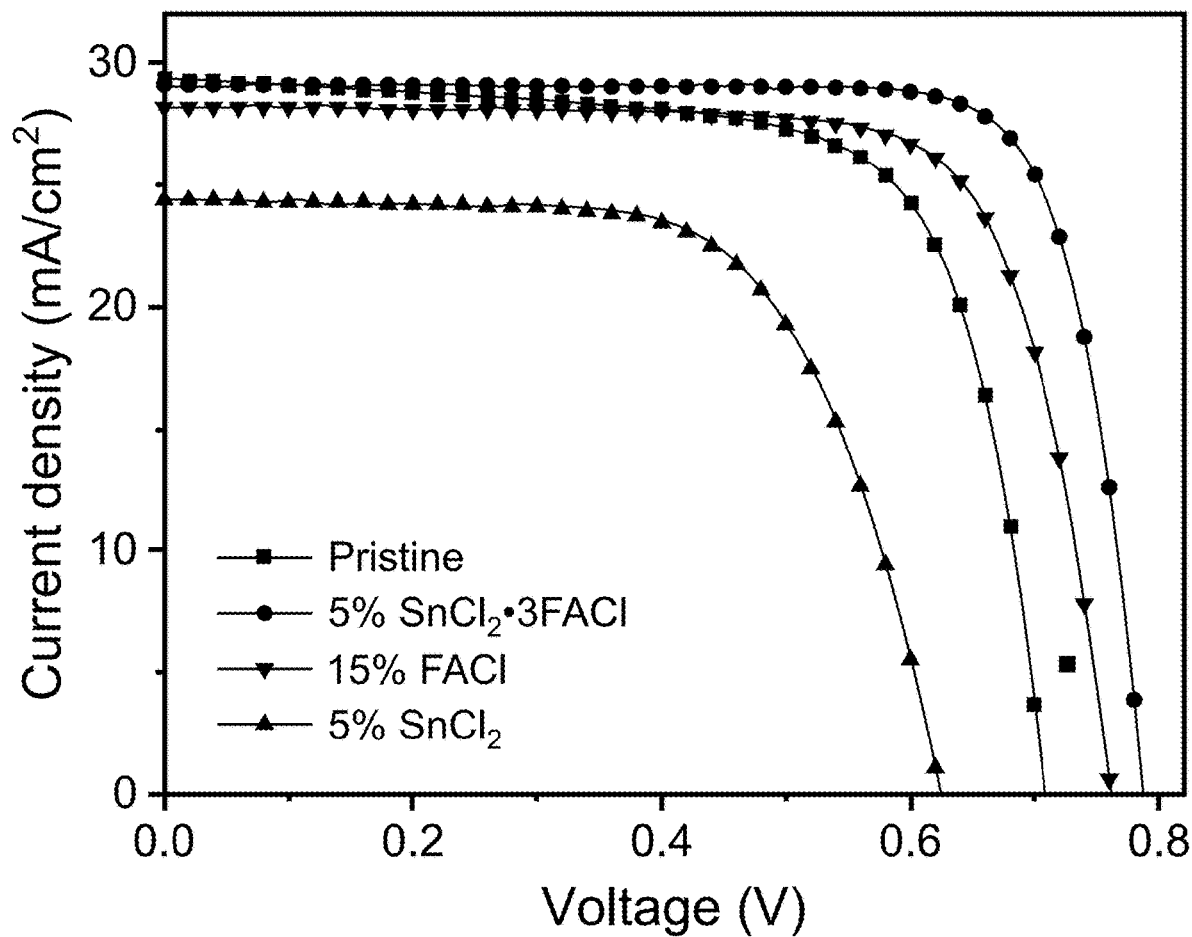
FIG. 8 illustrates J-V curves of $Cs_{0.3}FA_{0.7}Sn_{0.3}Pb_{0.7}I_3$ perovskite solar cells made without (pristine) and with different additives as indicated, according to some embodiments of the present disclosure. The 5%-$SnCl_2 \cdot 3FACl$ and pristine devices were the same as shown in FIGS. 1, A and B, respectively. The 15%-FACl device shows a PCE of 16.2% with a $J_{sc}$ of 28.2 mA/cm$^2$, $V_{oc}$ of 0.762 V, and FF of 75.5%. The 5%-$SnCl_2$ device shows a PCE of 10.1% with a $J_{sc}$ of 24.4 mA/cm$^2$, $V_{oc}$ of 0.624 V, and FF of 66.1%.

Note that the PSCs prepared with the $SnCl_2 \cdot xFACl$ additive, with x ranging from 1.5 to 4.5, all showed enhanced device performance compared to the PSCs without the additive (see FIG. 6), but x=3 resulted in the highest performance improvement. In addition, about 5 mol % of $SnCl_2 \cdot 3FACl$ (i.e., x about 3) addition was found to provide the best result (see FIG. 7). The best value of x equal to about 3, i.e., $SnCl_2 \cdot \sim 3FACl$, corresponds to a maximum; both x less than about 3 and x more than about 3 resulted in reduced device performances. So, the device performance versus the stoichiometry of $SnCl_2$ to FACl was not just a simple linear relationship. In addition, it can be seen that the large performance improvements were more than what would be expected from the simple additive effects of the individual additive components, i.e., $SnCl_2$ and FACl (see FIG. 8). Further, referring again to FIG. 7, the best value of about 5 mol % of $SnCl_2 \cdot 3FACl$ corresponds to a maximum; both less than about 5 mol % and more than about 5 mol % of the additive resulted in reduced device performances. So, the device performance versus additive concentration was not just a simple linear relationship.

Figure 9A:
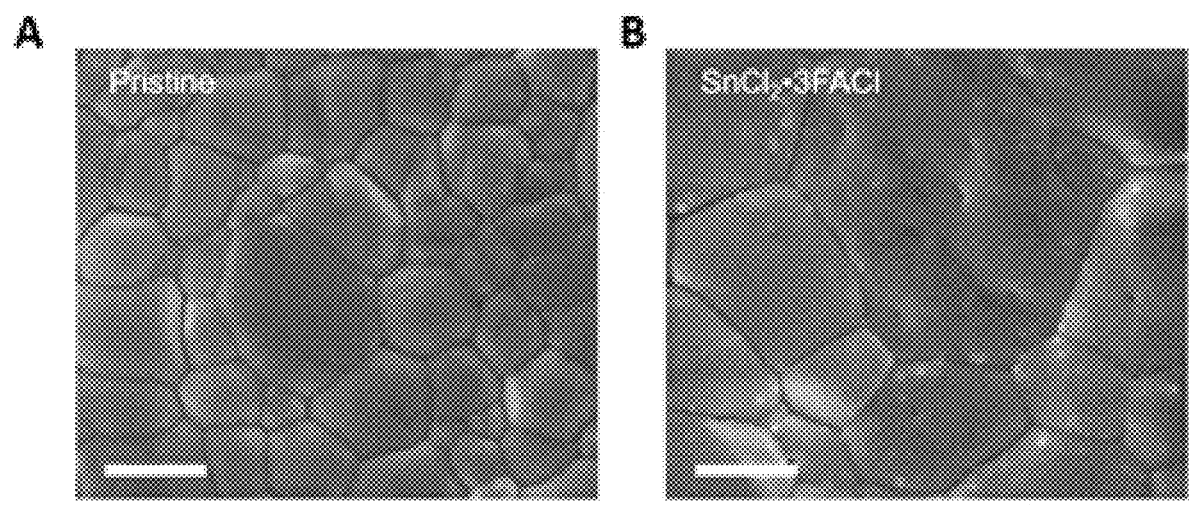
FIG. 9A illustrates a comparison of microstructure and physical properties of $Cs_{0.3}FA_{0.7}Sn_{0.3}Pb_{0.7}I_3$ perovskite thin films with $SnCl_2 \cdot 3FACl$ additive (5 mol %), Panel B, and without (pristine), Panel A, according to some embodiments of the present disclosure. Top-view SEM images (scale bar: 500 nm).
Figure 9B:
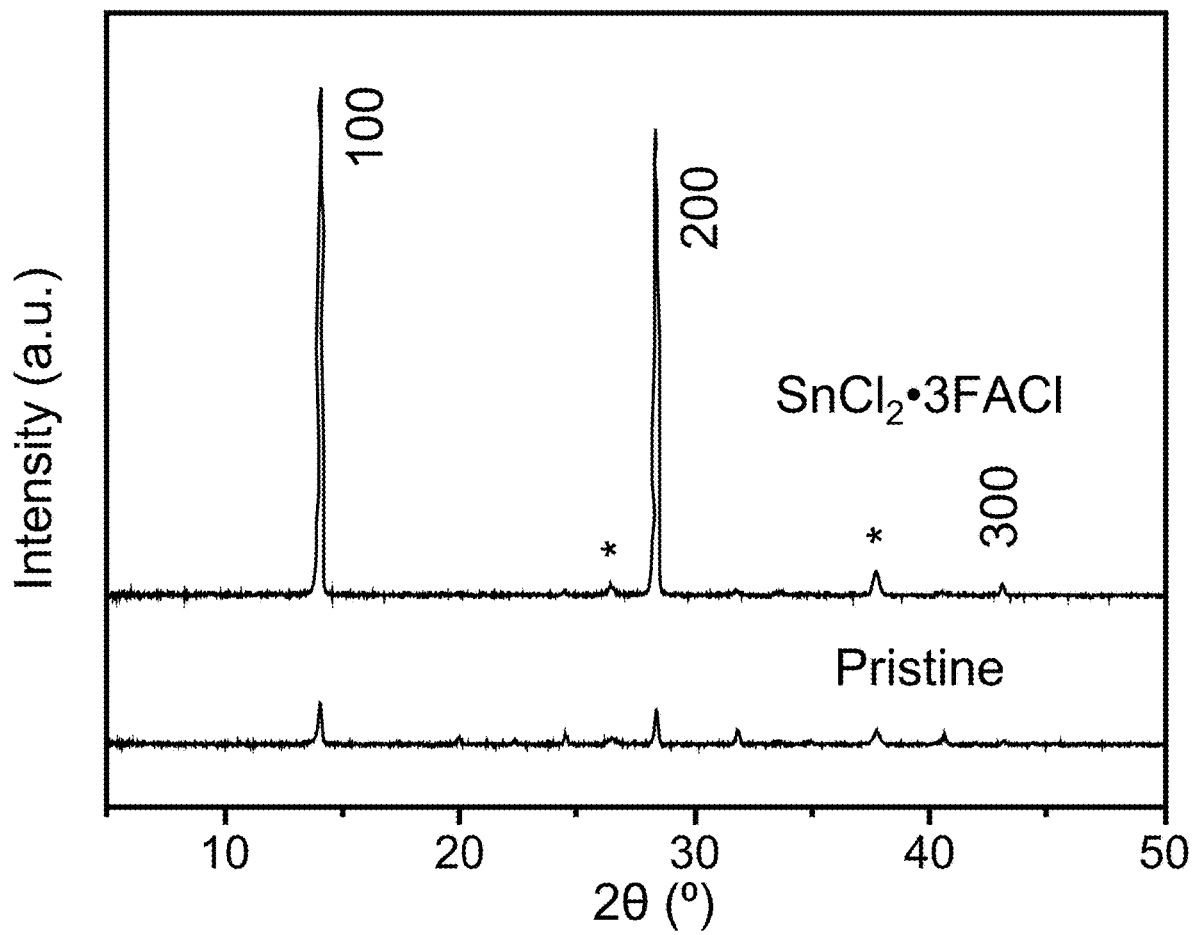
FIG. 9B illustrates a comparison of indexed XRD patterns (* marks peaks from the underlying substrate) of perovskite films made with and without additive, according to some embodiments of the present disclosure.
Figure 9C:
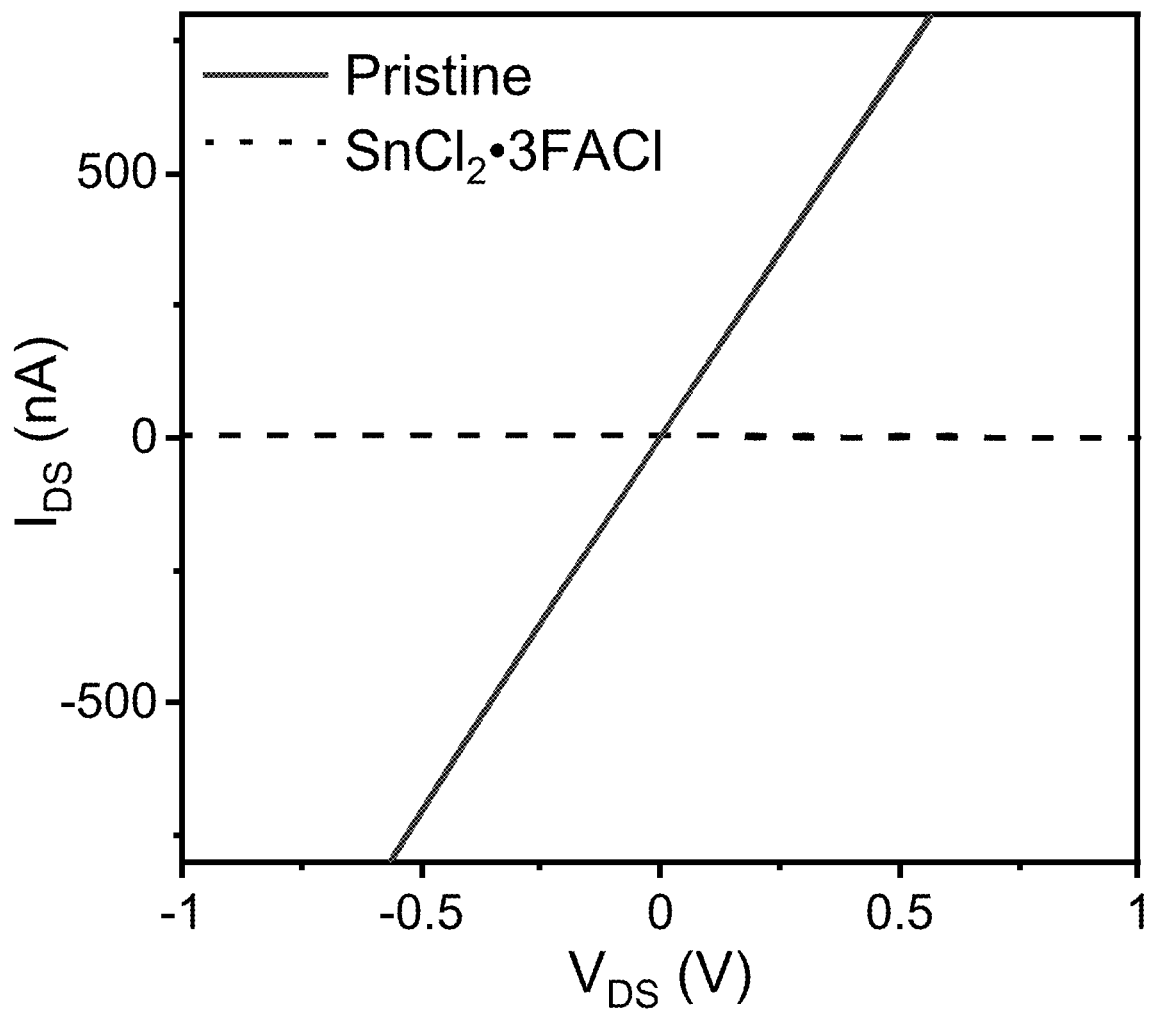
FIGS. 9C, 9D, and 9E illustrate a comparison of FET characterization of 'dark' carrier density, according to some embodiments of the present disclosure.
Figure 9D:
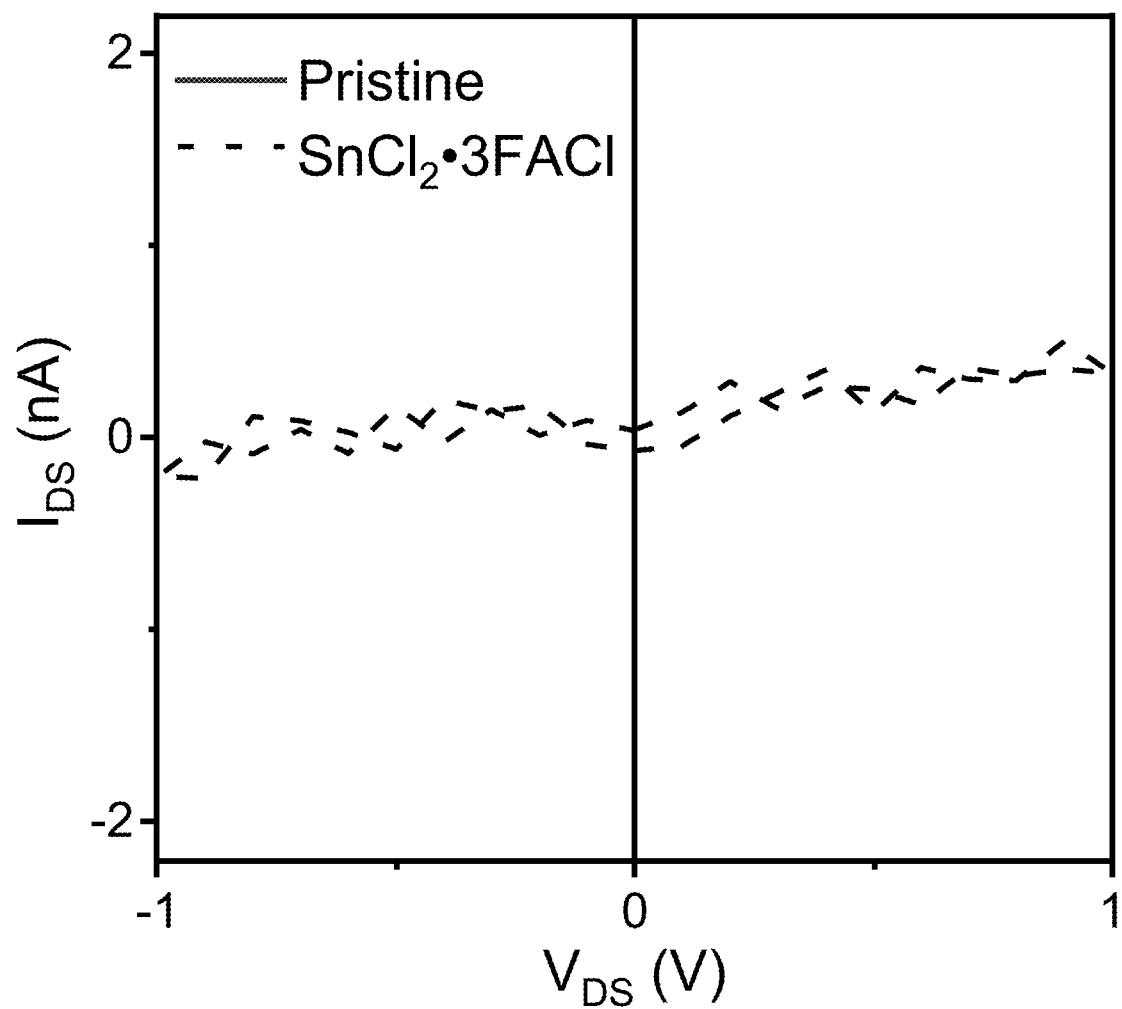
Figure 9E:
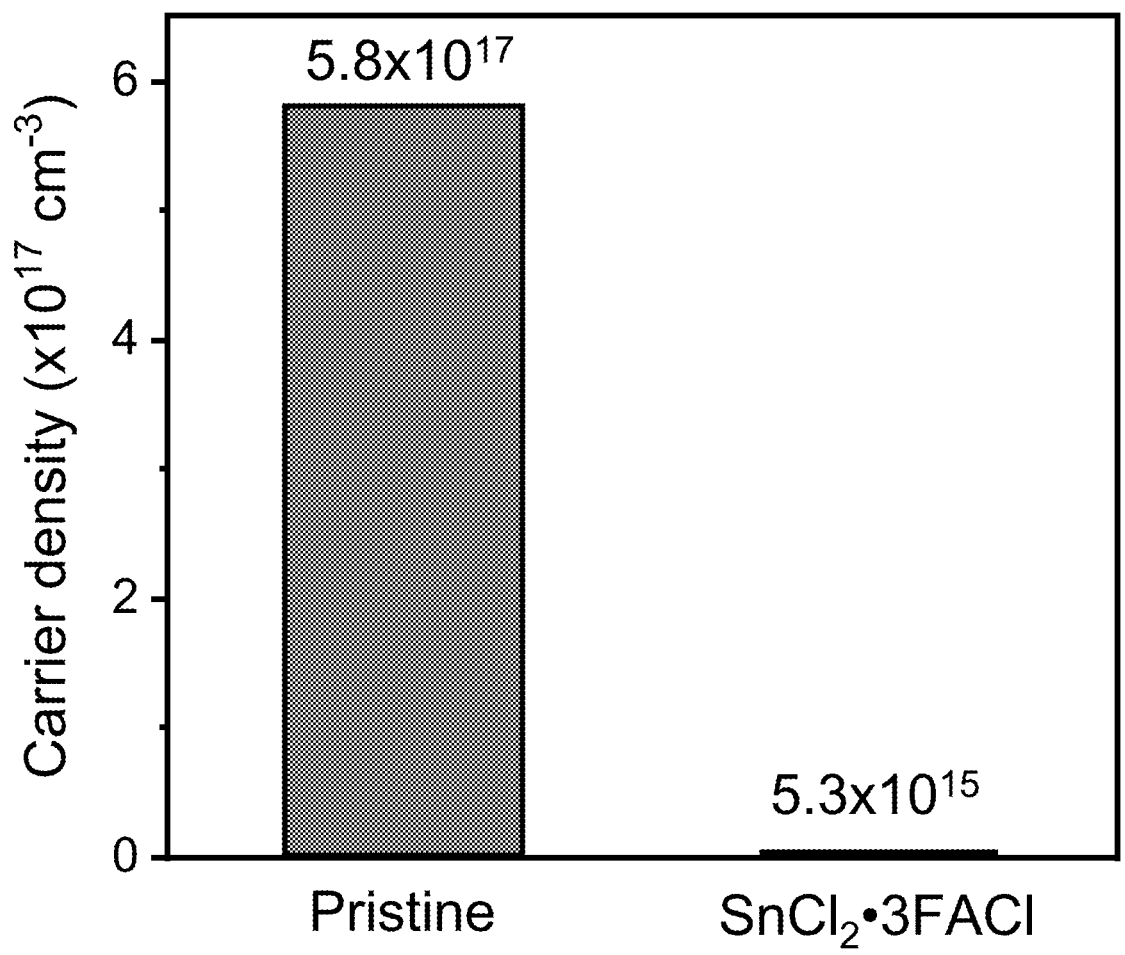
Figure 10:
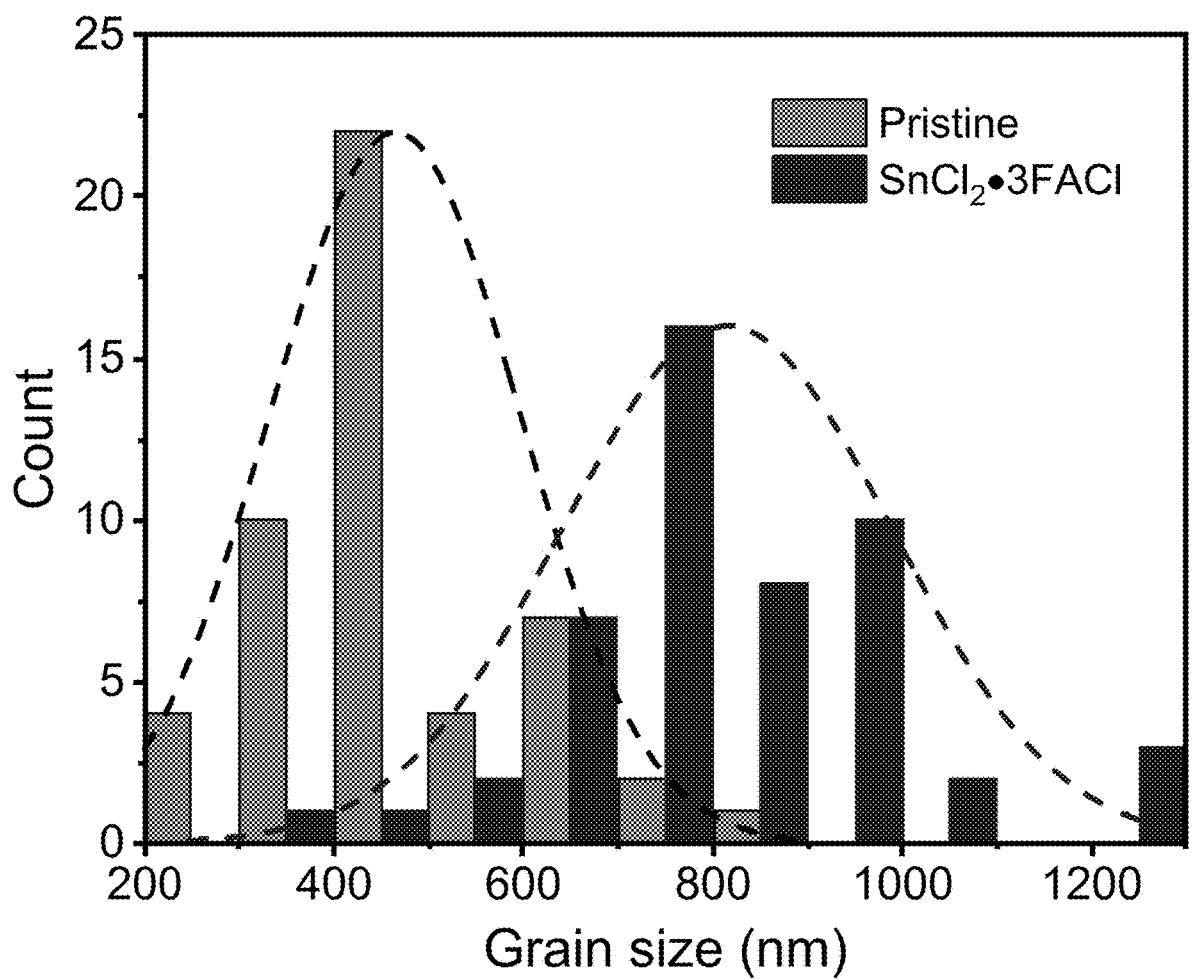
FIG. 10 illustrates a statistical comparison of apparent grain sizes for the pristine (no additive) and that made with $SnCl_2 \cdot 3FACl$ additive (5 mol %), according to some embodiments of the present disclosure.
Figure 11:
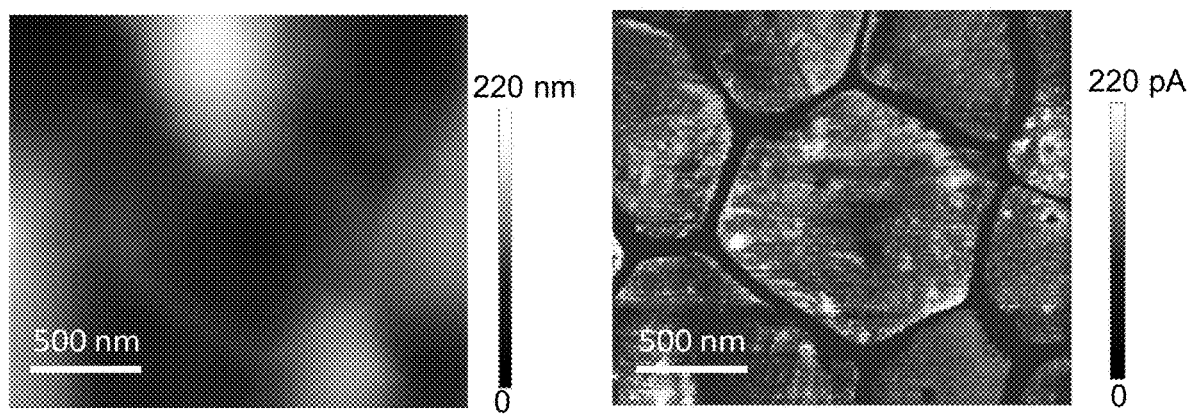
FIG. 11 illustrates an AFM analysis of a $Cs_{0.3}FA_{0.7}Sn_{0.3}Pb_{0.7}I_3$ perovskite thin film made with $SnCl_2 \cdot 3FACl$ (5 mol %) additives, according to some embodiments of the present disclosure: Panel A topography; Panel B current.
Figure 12A:
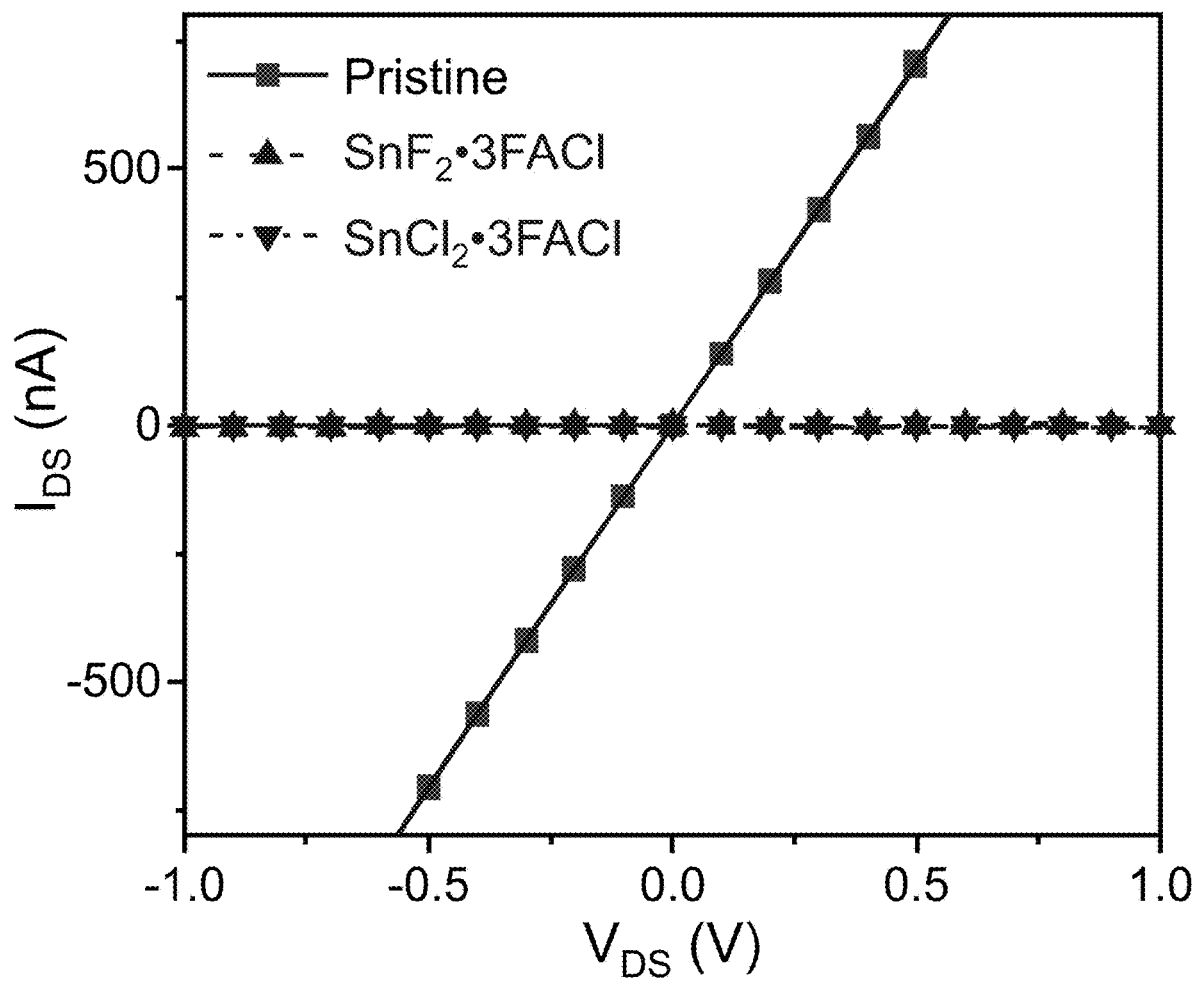
FIG. 12A illustrates current-voltage (I-V) curves of pristine, $SnF_2 \cdot 3FACl$, and $SnCl_2 \cdot 3FACl$ (5 mol %) devices with 10-μm channel length ($L_{ch}$) under 1-V $V_{DS}$ in the dark, inside a $N_2$-filled glovebox, according to some embodiments of the present disclosure.
Figure 12B:
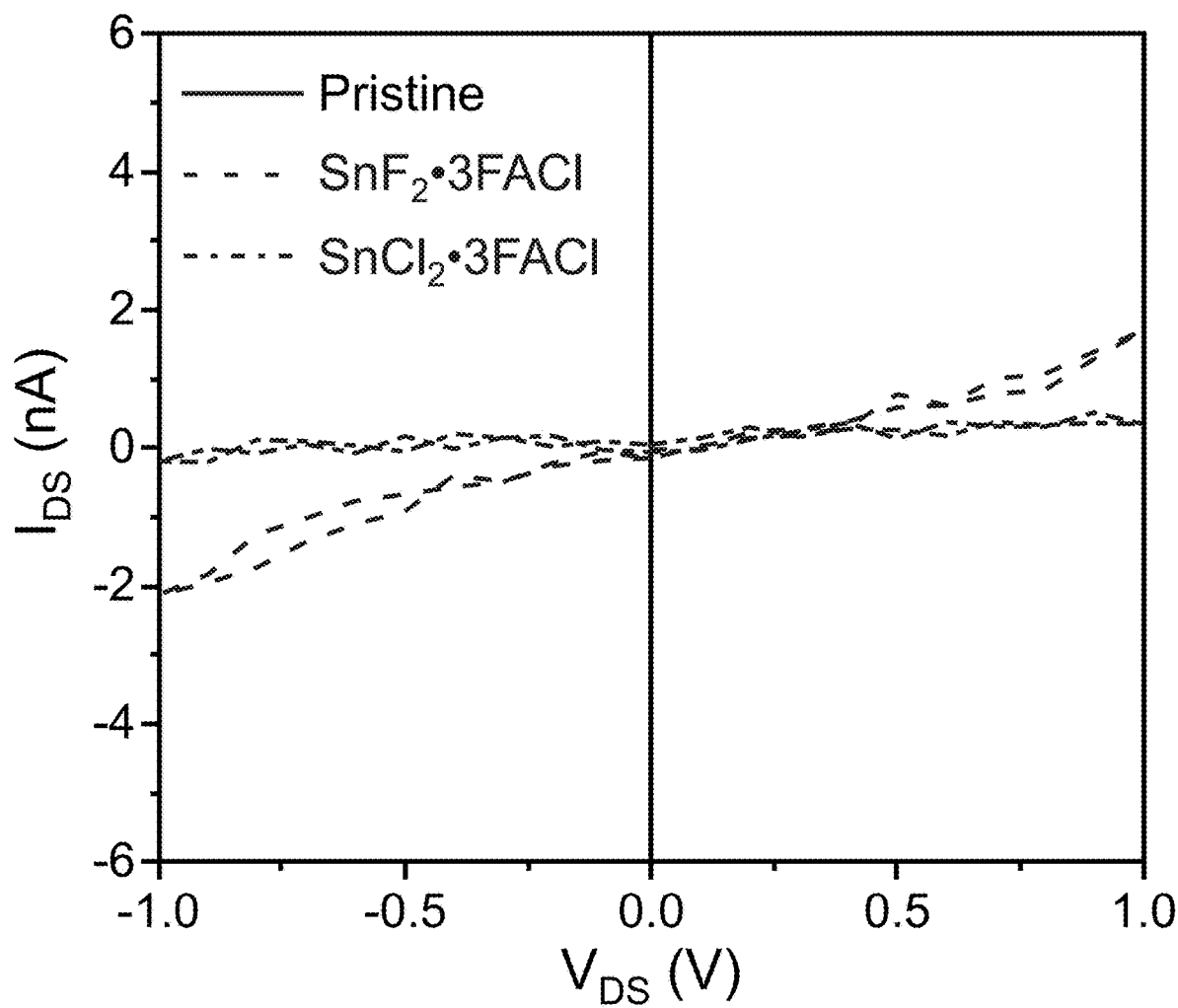
FIG. 12B illustrates zoom-in view plots of current-voltage (I-V) curves illustrated in FIG. 12A, according to some embodiments of the present disclosure.
Figure 12C:
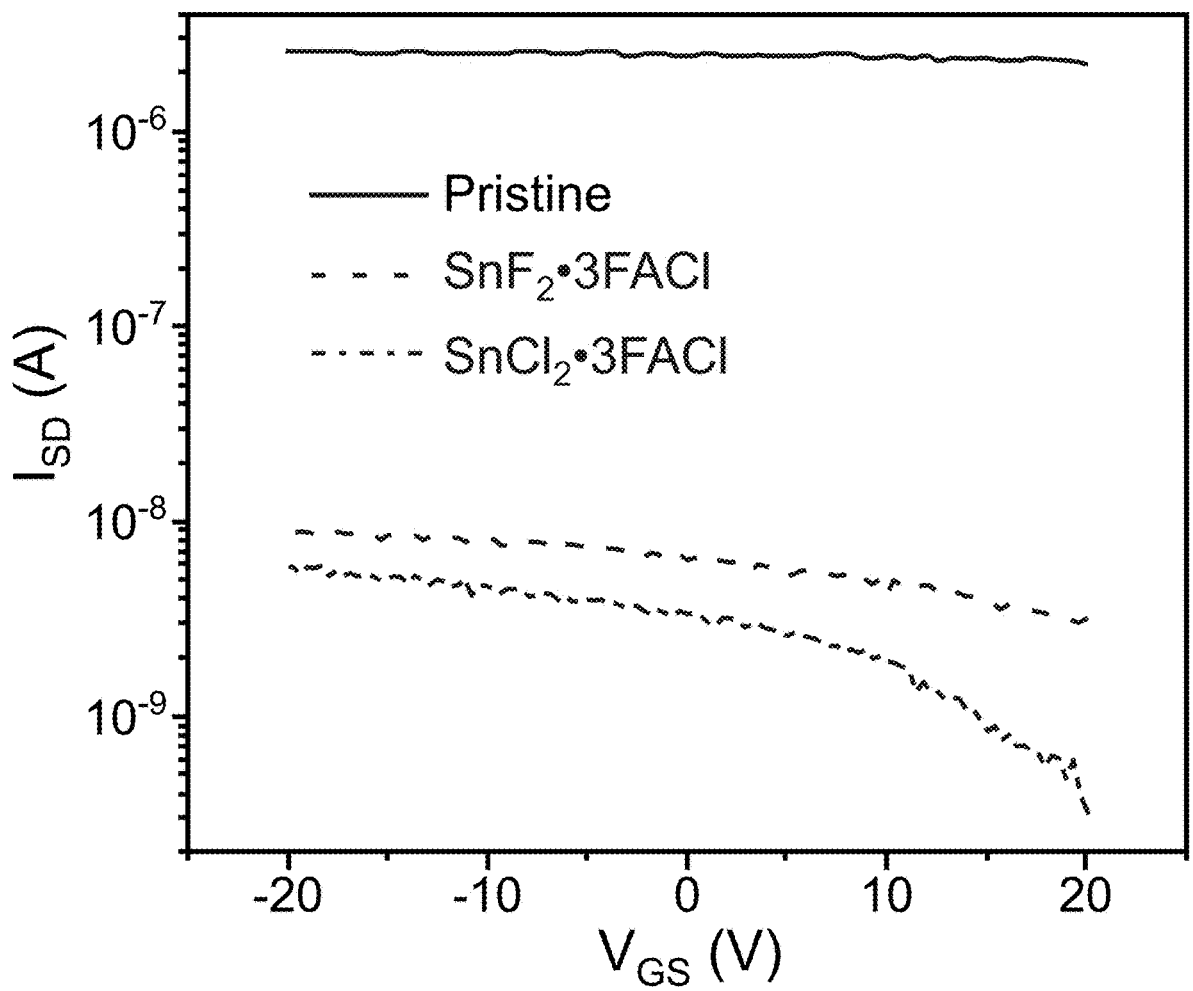
FIG. 12C illustrates FET transport curves of three types of perovskite devices under 1-V $V_{DS}$ with the $V_{GS}$ sweeping from +20 to −20 V with a fixed scanning rate 2.38 V/s in the dark, according to some embodiments of the present disclosure.
Figure 12D:
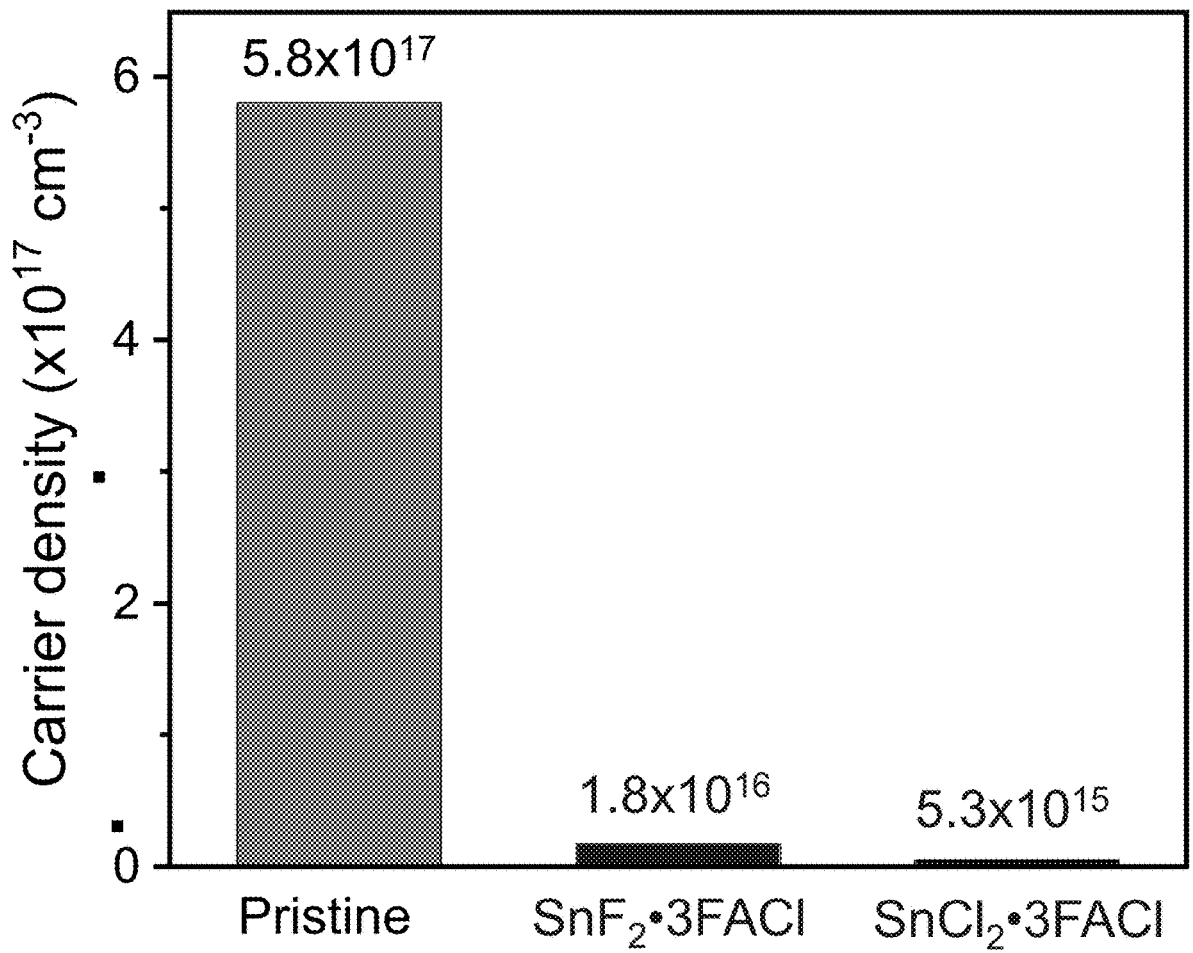
FIG. 12D illustrates the calculated hole carrier densities of pristine, $SnF_2 \cdot 3FACl$, and $SnCl_2 \cdot 3FACl$ perovskite samples, according to some embodiments of the present disclosure.
Figure 13A:
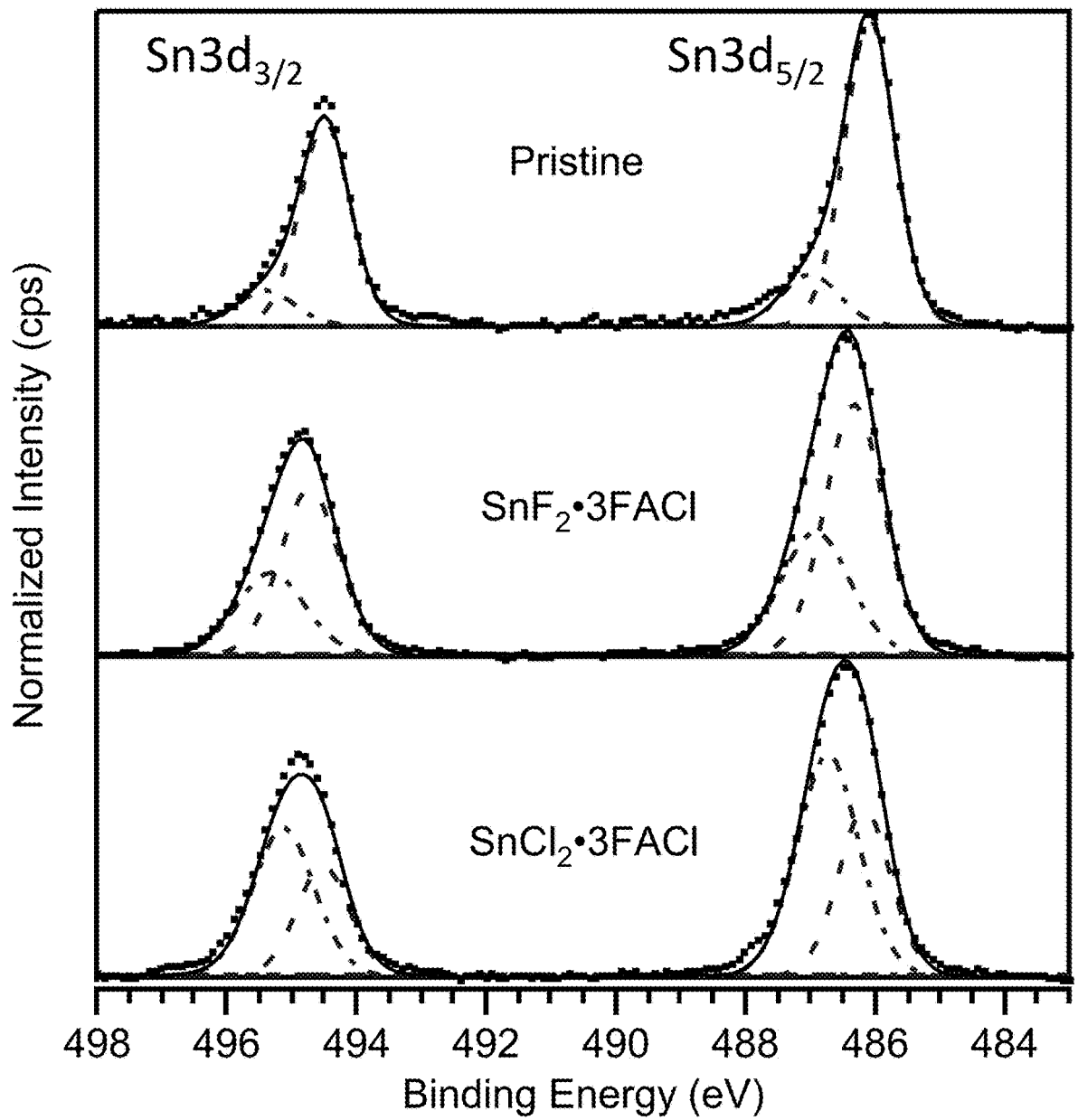
FIGS. 13A and 13B illustrate comparisons of the XPS spectra of Sn3d core levels of perovskite thin films prepared without additive (pristine) and with 5% $SnF_2 \cdot 3FACl$ or $SnCl_2 \cdot 3FACl$, according to some embodiments of the present disclosure. The Sn3d core levels show highly asymmetric peak shapes for the perovskite without additive, necessitating at least a two-component fit with a predominant contribution of a lower binding energy peak (~486.1 eV), relative to the small fraction at high binding energy (~487 eV). Inclusion of the 5% $SnF_2 \cdot 3FACl$ showed a relative increase in the higher binding energy fraction, as evident by a reduction in the asymmetry of the Sn3d core levels and an increase in the overall full width half maximum of the peak, with maximum counts at 486.5 eV (see Table 2). Finally, use of the 5% $SnCl_2 \cdot 3FACl$ additive showed a further increase in the higher binding energy component.
Figure 13B:
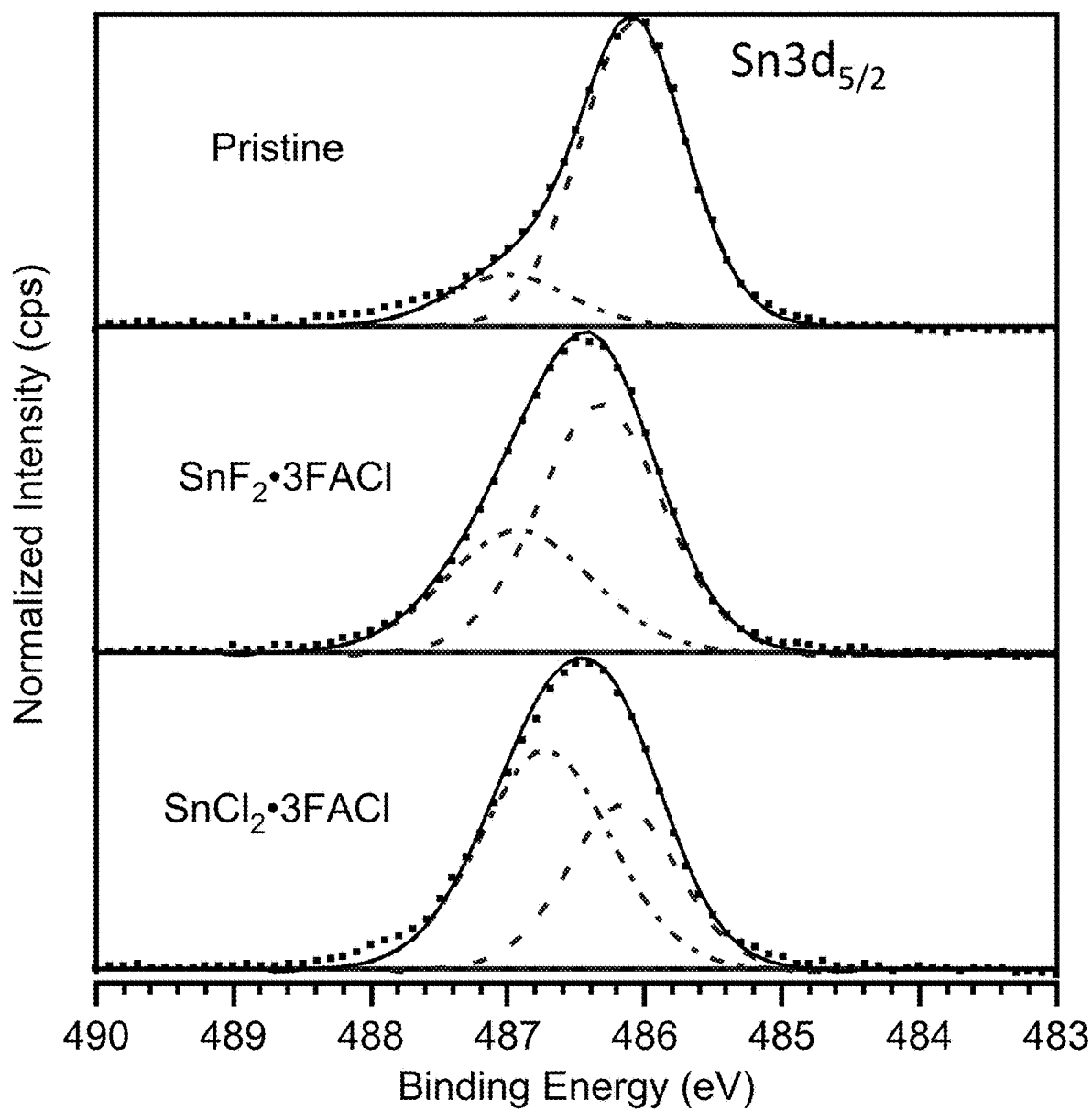

Physical properties of pristine and $SnCl_2 \cdot 3FACl$-added Sn—Pb perovskites. To understand the origin of the significantly improved device performance associated with using the $SnCl_2 \cdot 3FACl$ additive (5 mol %), a set of physical and optoelectronic properties of the films were characterized. The top-view scanning electron microscope (SEM) images in FIG. 9A show that the apparent grain size increased from a few hundred nanometers to about a micron with the additive. The statistical distribution of the apparent grain sizes of the pristine sample and that made with the $SnCl_2 \cdot 3FACl$ additive are further compared in FIG. 10. This can be attributed to the FACl component in the additive in facilitating the grain-boundary migration during the film growth. The indexed X-ray diffraction (XRD) patterns in FIG. 9B confirm the pure perovskite phase in both films, with and without $SnCl_2 \cdot 3FACl$ additive, but the film with the additive demonstrates about a 10-fold increase in the intensity on the same scale, and a 20% reduction in the FWHM (full width at half maximum) of the 100 peak, which indicates improved crystallinity. Furthermore, the $SnCl_2 \cdot 3FACl$ additive may passivate the grain boundaries by decorating them with $SnCl_2$ via a thermal decomposition process. The grain-boundary passivated microstructure was confirmed using conductive atomic force microscopy as shown in FIG. 11, where the grain boundaries are coated continuously with less conductive $SnCl_2$ phases. The electrical measurement based on a field-effect transistor (FET) configuration shows that the "dark" carrier density of the films was reduced by two orders of magnitude with the use of $SnCl_2 \cdot 3FACl$ additive (see FIGS. 9C-9E and FIGS. 12A-12D), which is indicative of a very low defect density in that film. These results correlate well with X-ray photoelectron spectroscopy (XPS) analysis of the corresponding perovskite films (see FIGS. 13A and 13B and Table 2).

Figure 15:
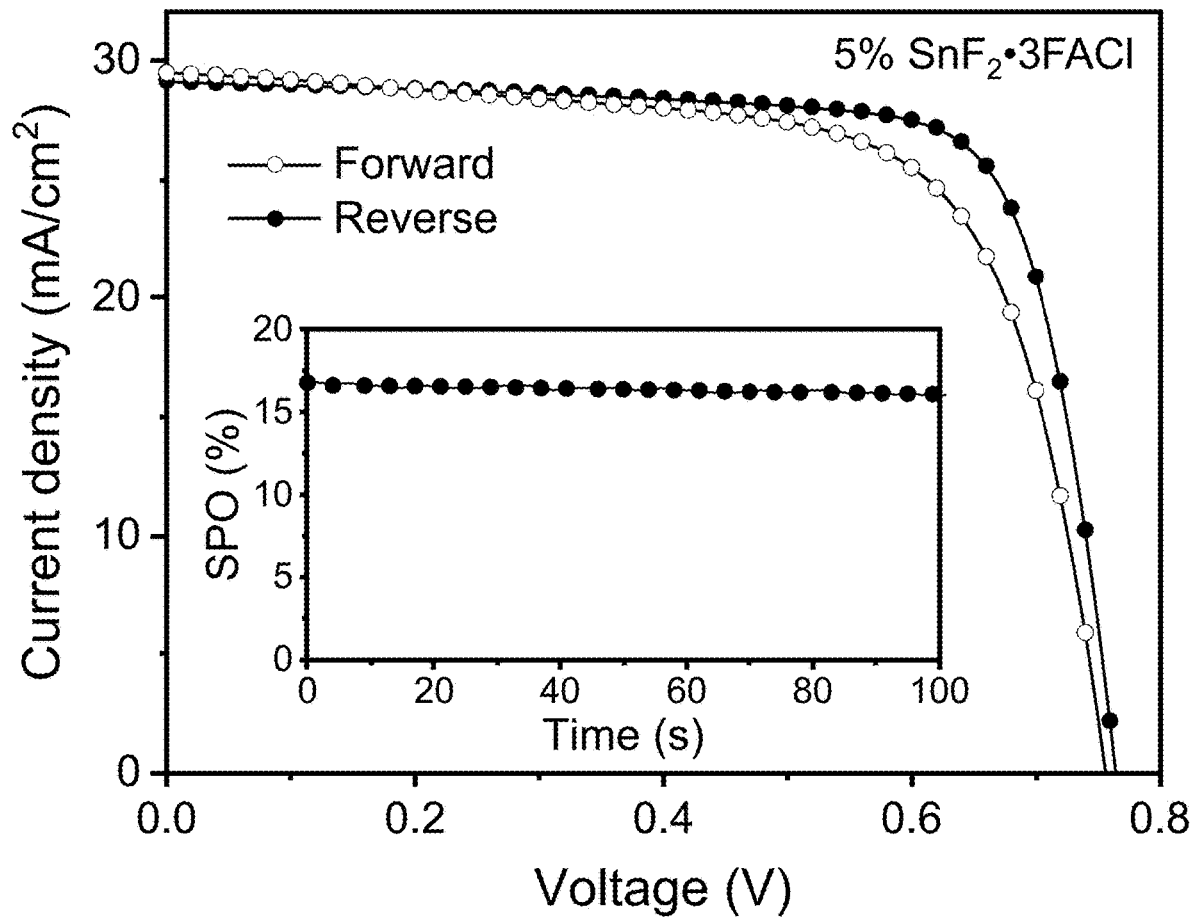
FIG. 15 illustrates J-V curves of $Cs_{0.3}FA_{0.7}Sn_{0.3}Pb_{0.7}I_3$ perovskite solar cell made with $SnF_2 \cdot 3FACl$ (5 mol %) additive), according to some embodiments of the present disclosure. The reverse-scan J-V curve yields a PCE of 17.1% with $J_{sc}$ of 29.1 mA/cm$^2$, $V_{oc}$ of 0.765 V, and FF of 76.8%. The forward-scan J-V curve yields a PCE of 15.3% with a $J_{sc}$ of 29.5 mA/cm$^2$, $V_{oc}$ of 0.756 V, and FF of 68.4%. The SPO efficiency is 16.6% (inset).

$SnF_2 \cdot 3FACl$-additive-based film exhibited about 3-fold higher dark carrier density (see FIGS. 12A-12D), compared to the $SnCl_2 \cdot 3FACl$-additive-based film. Furthermore, the $SnF_2 \cdot 3FACl$-additive-based device only reached an SPO efficiency of about 16.6% (see FIG. 15 and Table 1), which is higher than the pristine device (14.2%, see FIG. 5A), but is significantly lower than the $SnCl_2 \cdot 3FACl$-additive device (18.3%, see FIG. 5A). These results indicate that improved morphology and crystallinity alone may not be sufficient to account for the significant improvements in the PSC performance observed using the $SnCl_2 \cdot 3FACl$-additive.

Figure 16:
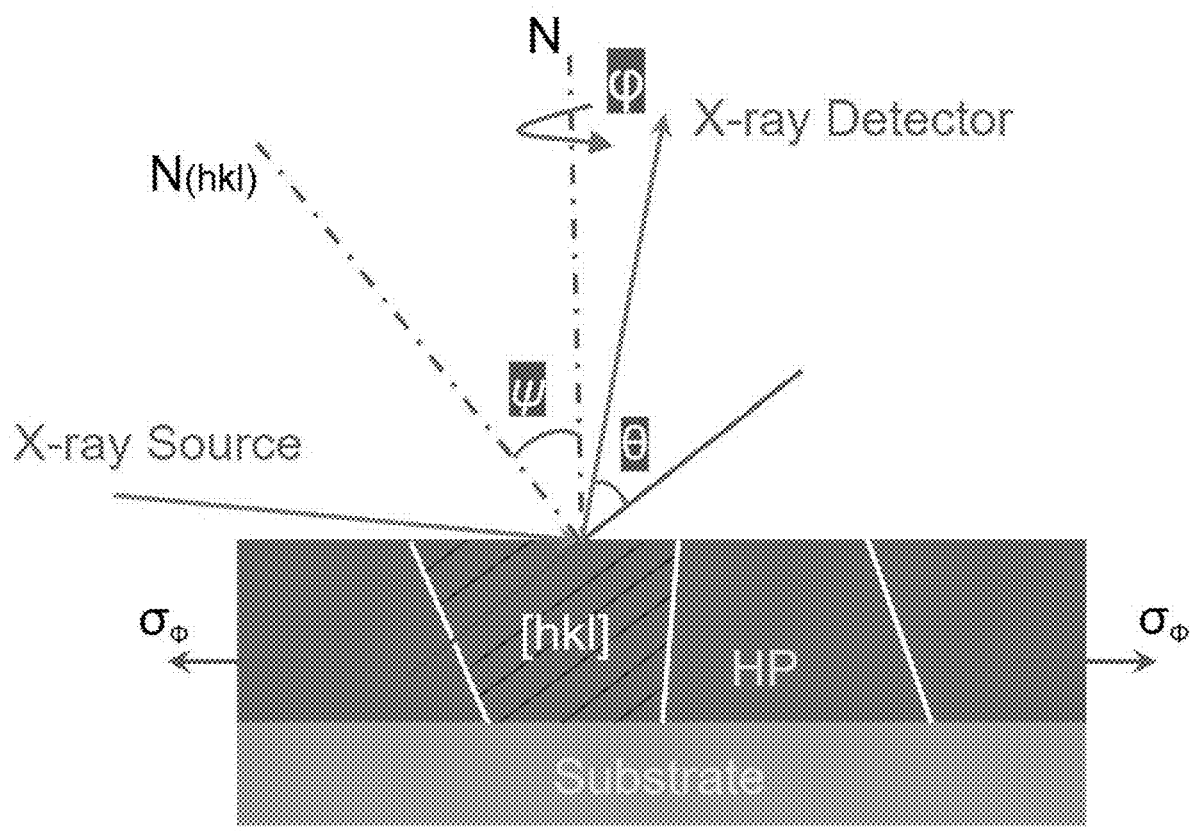
FIG. 16 illustrates a schematic of the XRD $\sin^2\psi$ method for quantifying the residual stress in polycrystalline halide perovskite thin films, according to some embodiments of the present disclosure.
Figure 17A:
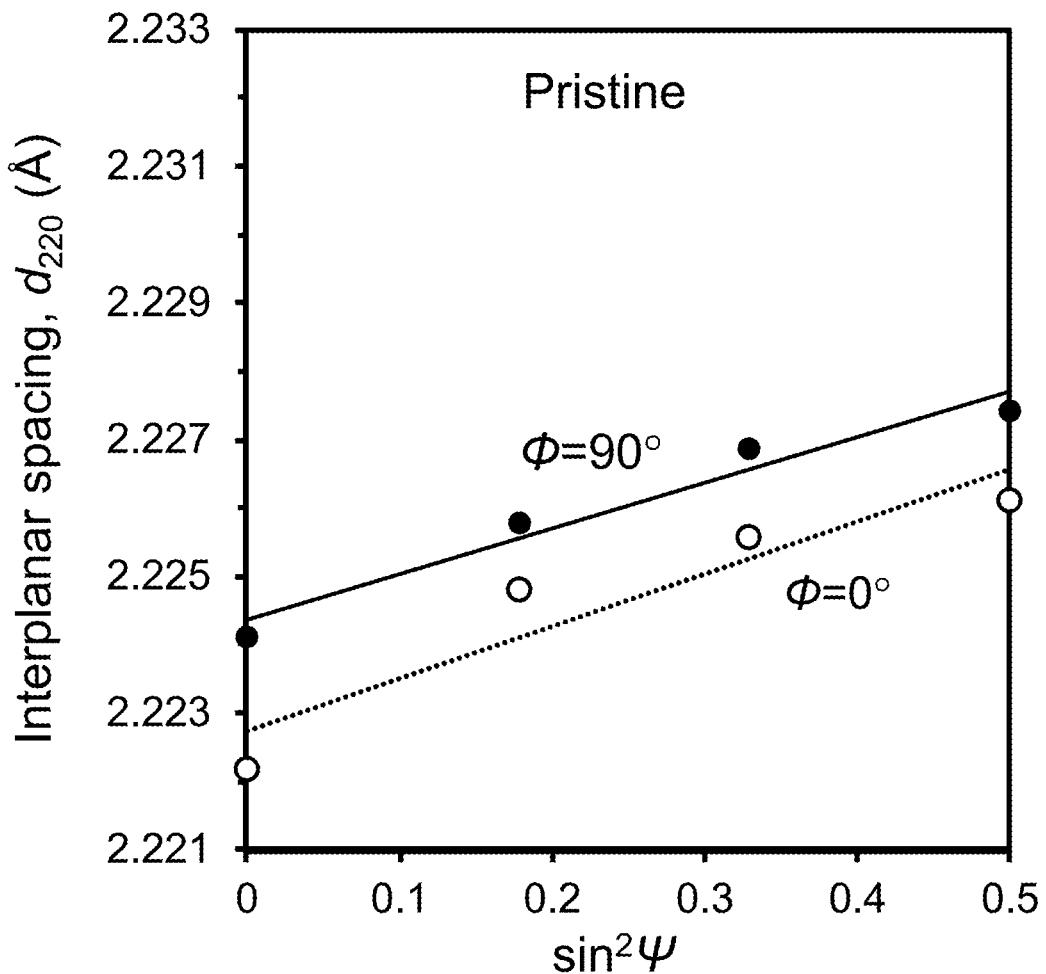
FIG. 17A illustrates XRD $d_{220}$ vs. $\sin^2\psi$ plots for the $Cs_{0.3}FA_{0.7}Sn_{0.3}Pb_{0.7}I_3$ perovskite thin films without (pristine) $SnCl_2 \cdot 3FACl$ additive, according to some embodiments of the present disclosure.
Figure 17B:
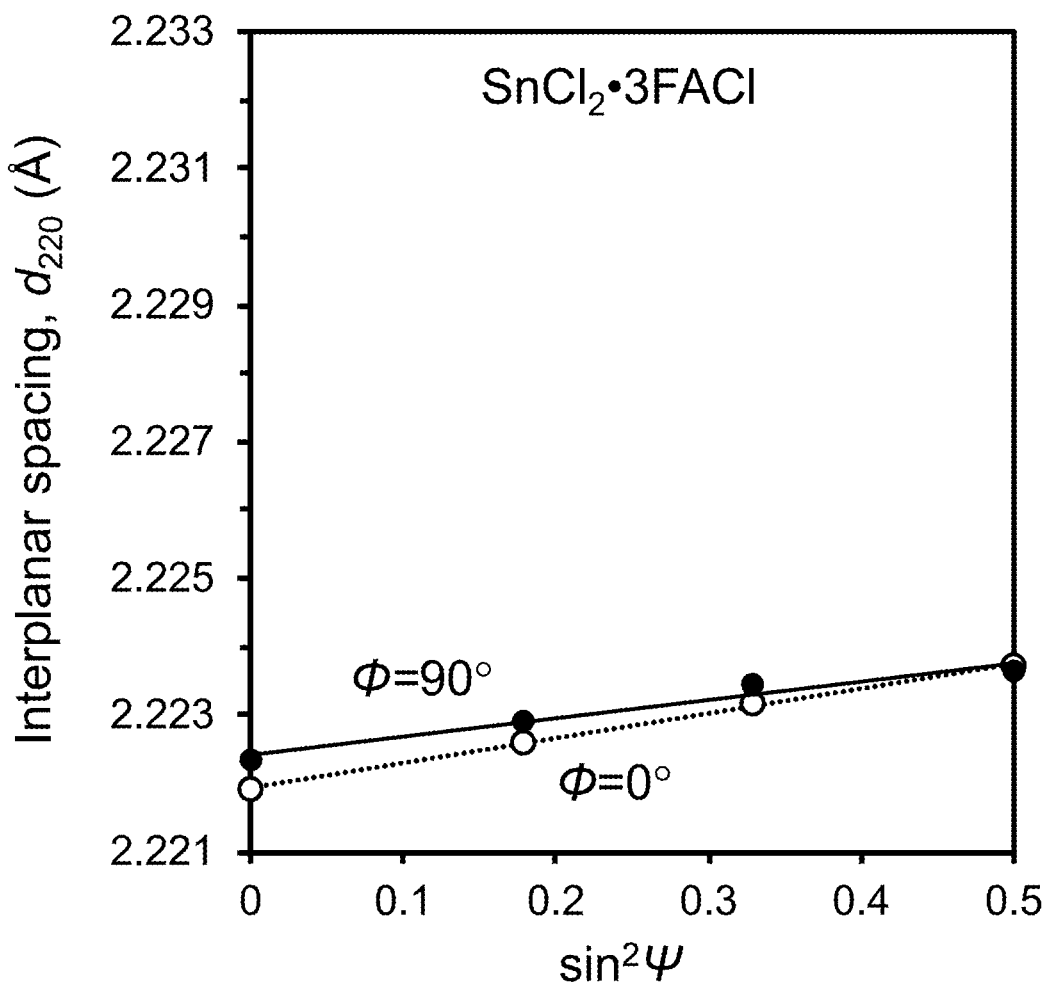
FIG. 17B illustrates XRD $d_{220}$ vs. $\sin^2\psi$ plots for the $Cs_{0.3}FA_{0.7}Sn_{0.3}Pb_{0.7}I_3$ perovskite thin films with $SnCl_2 \cdot 3FACl$ additive (5 mol %), according to some embodiments of the present disclosure.

Strain relaxation due to $SnCl_2 \cdot 3FACl$ additive. Recently can affect charge transport and chemical stability of perovskite films. There is often a biaxial tensile residual stress in solution-processed perovskite films, associated with the film formation process and the coefficient of thermal expansion (CTE) mismatch between the film and the substrate. In general, such strain is detrimental to PSC operation as it can increase charge recombination, decrease perovskite stability, and reduce mechanical reliability. In order to evaluate the possible effect of residual stress, $Cs_{0.3}FA_{0.7}Sn_{0.3}Pb_{0.7}I_3$ perovskite films without additive (pristine) and with the $SnCl_2.3FACl$ additive (5 mol %) were characterized using the well-established XRD $\sin^2\psi$ method, as illustrated in FIG. 16. In FIGS. 17A and 17B, (220) interplanar spacing ($d_{220}$) is plotted as a function of $\sin^2\psi$ for $Cs_{0.3}FA_{0.7}Sn_{0.3}Pb_{0.7}I_3$ perovskite films without and with the $SnCl_2.3FACl$ additive, respectively. A positive slope of the linear fit to the $d_{220}$–$\sin^2\psi$ data for the pristine film indicates the presence of biaxial tensile residual stress (or strain). In contrast, the film synthesized with the $SnCl_2 \cdot 3FACl$ additive shows a much lower positive slope. The biaxial residual stress (GR) can be estimated from the $\sin^2\psi$ data in FIGS. 17A and 17B using the relation:

TABLE 2

XPS analysis of perovskite films prepared with and without using additives.

| Elemental region | $Cs_{0.3}FA_{0.7}Sn_{0.3}Pb_{0.7}I_3$ | | $Cs_{0.3}FA_{0.7}Sn_{0.3}Pb_{0.7}I_3$ + 5% $SnF_2 \cdot 3FACl$ | | $Cs_{0.3}FA_{0.7}Sn_{0.3}Pb_{0.7}I_3$ + 5% $SnCl_2 \cdot 3FACl$ | |
|---|---|---|---|---|---|---|
| | Atomic % | Binding Energy (eV) at Maximum Counts | Atomic % | Binding Energy (eV) at Maximum Counts | Atomic % | Binding Energy (eV) at Maximum Counts |
| Pb4f$_{7/2}$ | 11.2 | 137.8 | 14.5 | 138.0 | 13.8 | 138.0 |
| Cs3d$_{5/2}$ | 4.2 | 724.5 | 4.6 | 724.5 | 4.6 | 724.5 |
| N1s* | 23.8 | 400.1 | 16.5 | 400.1 | 17.7 | 400.2 |
| Sn3d$_{5/2}$ | 5.1 | 486.1 | 9.4 | 486.5 | 9.3 | 486.4 |
| I3d$_{5/2}$ | 55.8 | 618.8 | 49.9 | 618.9 | 48.1 | 618.9 |
| Cl2p$_{3/2}$ | undetectable | NA | 5.2 | 198.0 | 6.5 | 198.1 |
| F1s | undetectable | NA | undetectable | NA | undetectable | NA |

*N1s used to infer FA (only one peak).

Figure 14:
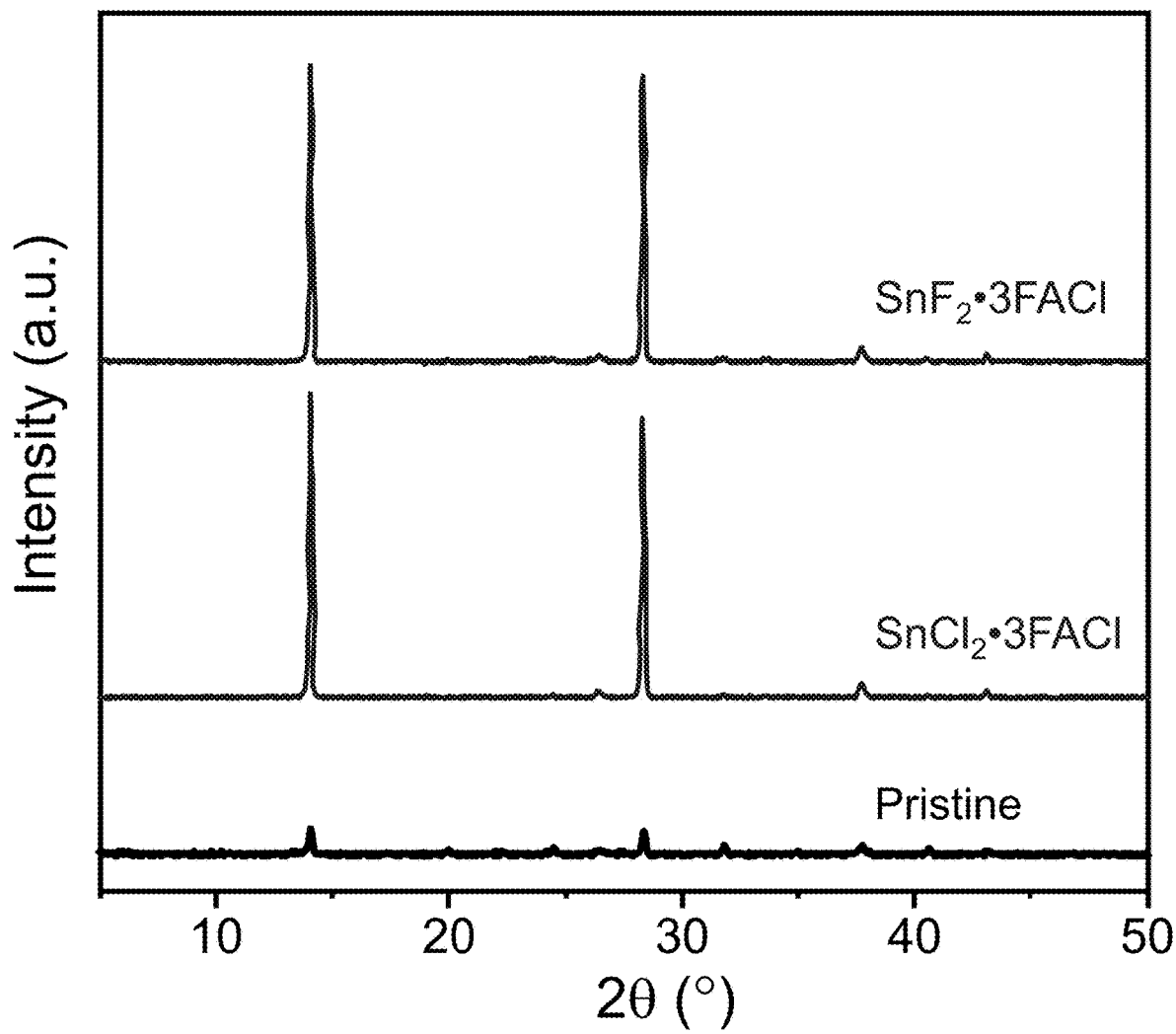
FIG. 14 illustrates XRD patterns of the $Cs_{0.3}FA_{0.7}Sn_{0.3}Pb_{0.7}I_3$ perovskite thin films prepared with $SnCl_2 \cdot 3FACl$ (5 mol %), with $SnF_2 \cdot 3FACl$ (5 mol %), and without additives, according to some embodiments of the present disclosure.
Figure 17C:
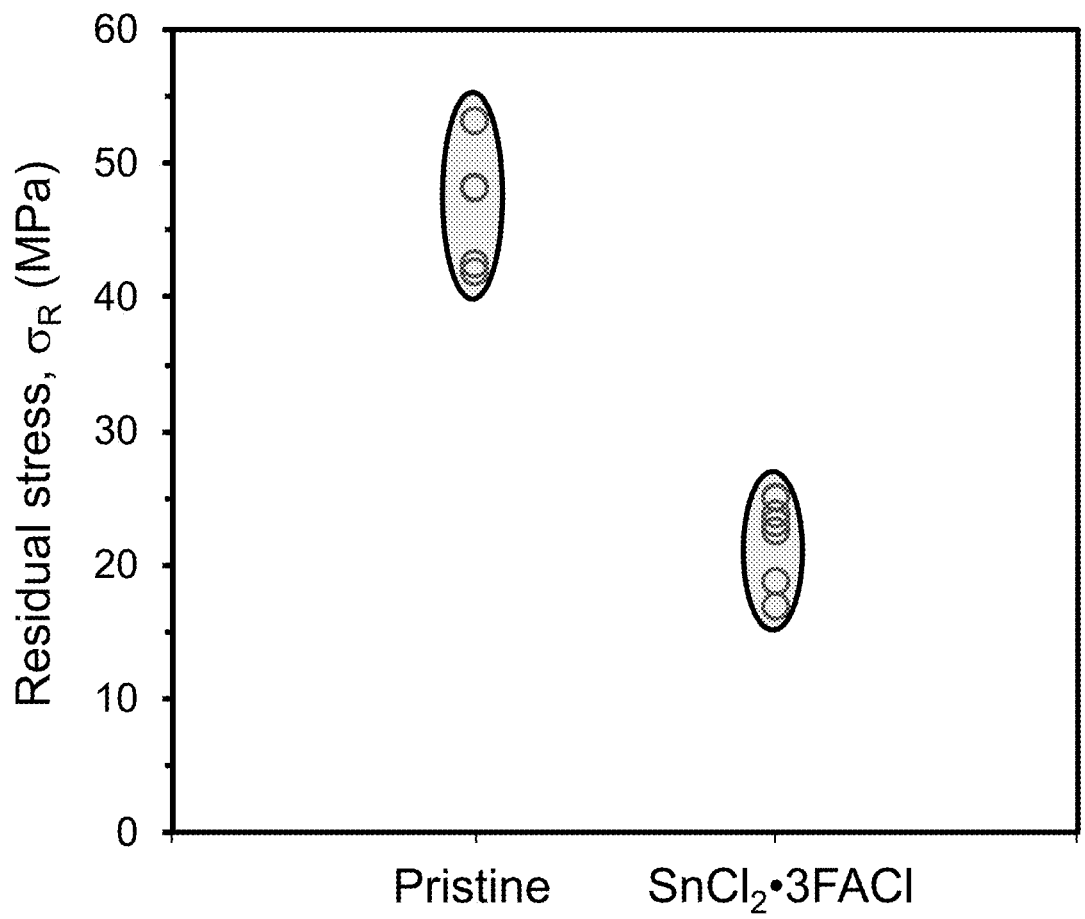
FIG. 17C illustrates a comparison of the residual stress in the $Cs_{0.3}FA_{0.7}Sn_{0.3}Pb_{0.7}I_3$ perovskite thin films without and with $SnCl_2 \cdot 3FACl$ additive, according to some embodiments of the present disclosure. Five measurements per film were performed, and for each measurement both φ=0 and 90° orientations were used, indicating equi-biaxial state of the residual stress.
Figure 18:
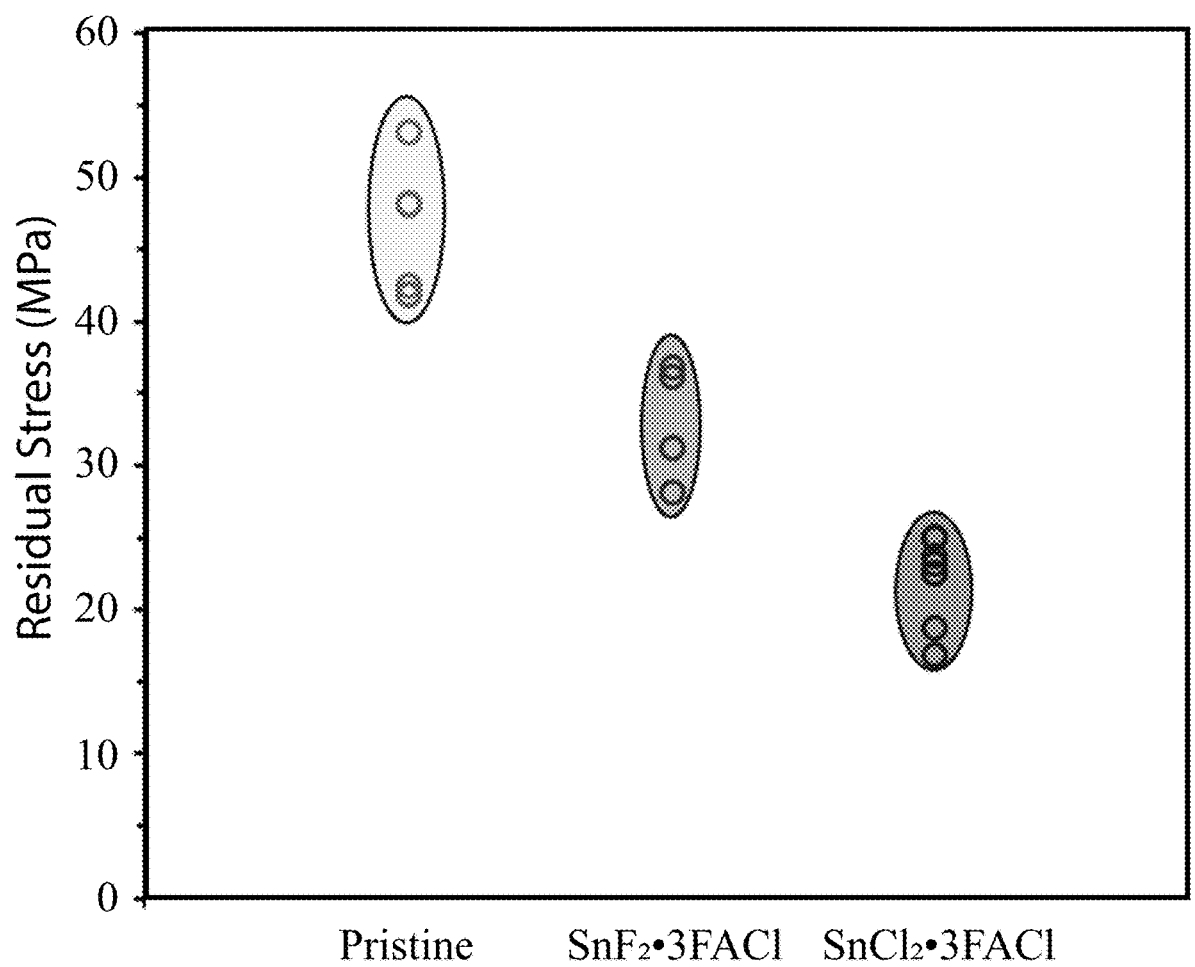
FIG. 18 illustrates a statistical comparison of the residue stresses in the $Cs_{0.3}FA_{0.7}Sn_{0.3}Pb_{0.7}I_3$ perovskite thin films without additive, with $SnF_2 \cdot 3FACl$ (5 mol %), and with $SnCl_2 \cdot 3FACl$ (5 mol % additives), according to some embodiments of the present disclosure. Five measurements per film.

The improved microstructure and crystallinity of perovskite films are often important factors that contribute to enhancing PSC performance. In this context, another set of $Cs_{0.3}FA_{0.7}Sn_{0.3}Pb_{0.7}I_3$ perovskite films and devices were prepared using a different additive, $SnF_2 \cdot 3FACl$ (5 mol %). In comparison with the pristine films without any additive, the use of $SnF_2 \cdot xFACl$ additive also enhanced the crystallinity (see FIG. 14) and apparent grain size significantly, to a degree similar to that observed in the $SnCl_2 \cdot 3FACl$ additive case. The optical bandgap and absorption are also similar for films prepared using $SnCl_2 \cdot 3FACl$ and $SnF_2 \cdot 3FACl$ additives (see FIGS. 3A and 3B). However, the $$\sigma_R = \left(\frac{E_{(220)}}{1+v}\right)\left(\frac{m}{d_n}\right), \quad (1)$$

where m is the slope of the linear fit to the data, $d_n$ is the $d_{220}$ spacing at $\sin^2\psi = 0$ (y-intercept), $E_{<220>}$ is the Young's modulus in the <220> direction, and v is the Poisson's ratio. $E_{<220>}$ is estimated as 18.5 GPa, as shown in the Supplementary Materials. The typical v value of 0.33 is assumed. The calculated residual stresses for $Cs_{0.3}FA_{0.7}Sn_{0.3}Pb_{0.7}I_3$ perovskite films with and without $SnCl_2 \cdot 3FACl$ additive are presented in FIG. 17C. Overall, the tensile GR in the pristine film (i.e., no additive used in its synthesis) is estimated at 42-51 MPa, which is reduced to only 19-24 MPa for the $SnCl_2 \cdot 3FACl$ case. In addition, it was found that replacing the $SnCl_2 \cdot 3FACl$ additive with $SnF_2 \cdot 3FACl$ can also reduce the residual stress to some extent, but not as much as $SnCl_2 \cdot 3FACl$ (see FIG. 18). Based on these results, the reduced residual stresses in the film associated with the $SnCl_2 \cdot 3FACl$ additive is likely to be an important factor contributing to the exceptional device performance, in addition to the microstructural considerations.

Figure 17D:
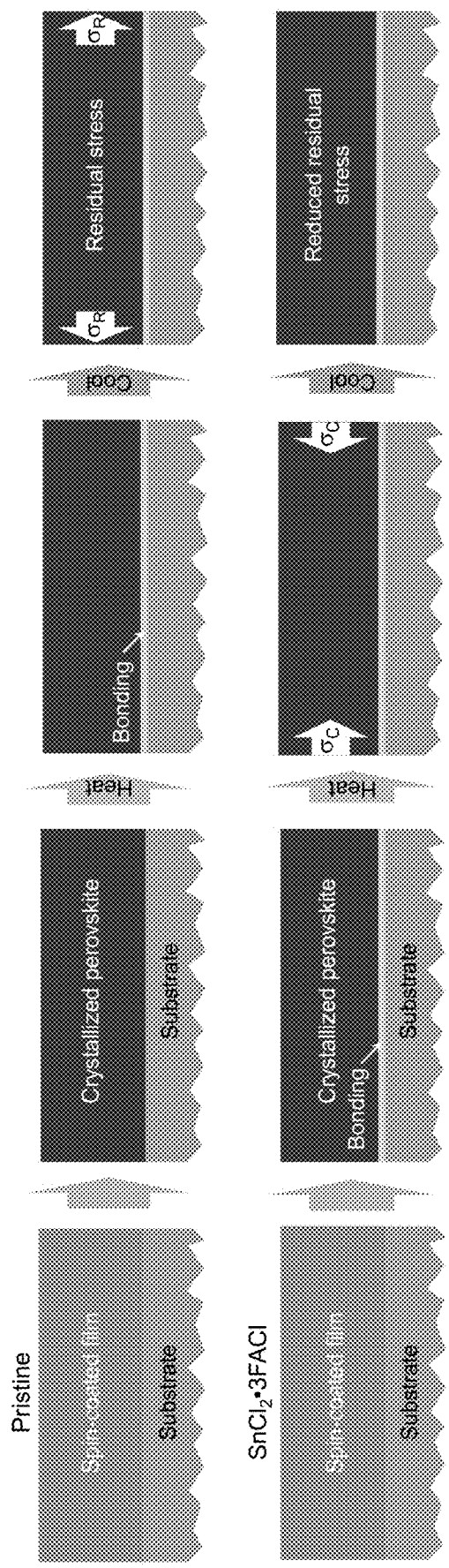
FIG. 17D illustrates a schematic showing the proposed mechanism for reduced tensile residual stress ($\sigma_R$) using $SnCl_2 \cdot 3FACl$ additive based on the supplementary results (see FIGS. 19-21) from the film delamination tests), according to some embodiments of the present disclosure. ($\sigma_C$ implies residual compression.)
Figure 19:
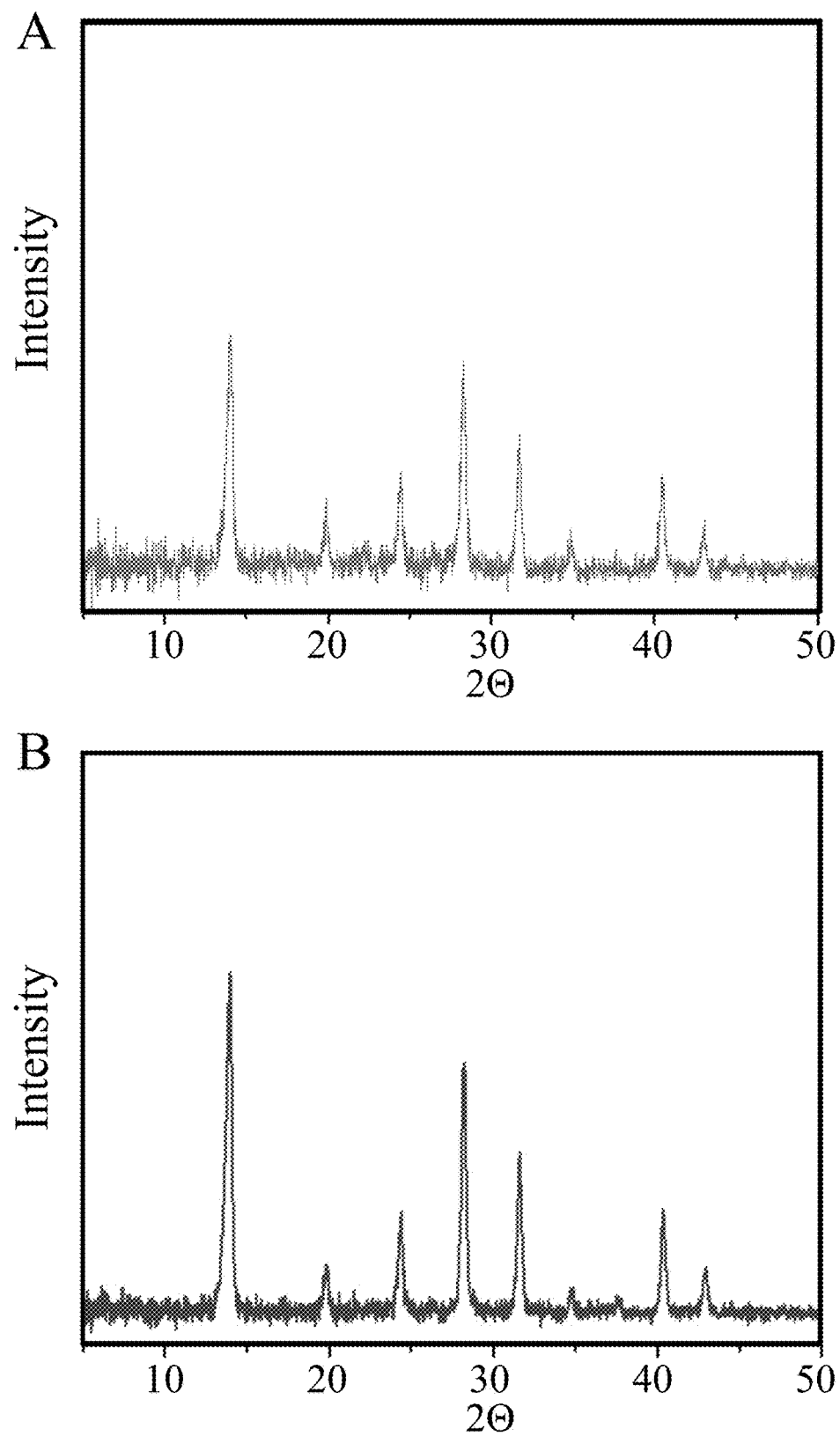
FIG. 19 illustrates an XRD comparison of perovskite films made by the methods described herein, according to some embodiments of the present disclosure. Pure perovskite phase formed immediately after the spin-coating process for both additive free (Panel A) and SnCl$_2$·3FACl cases (Panel B).
Figure 20:
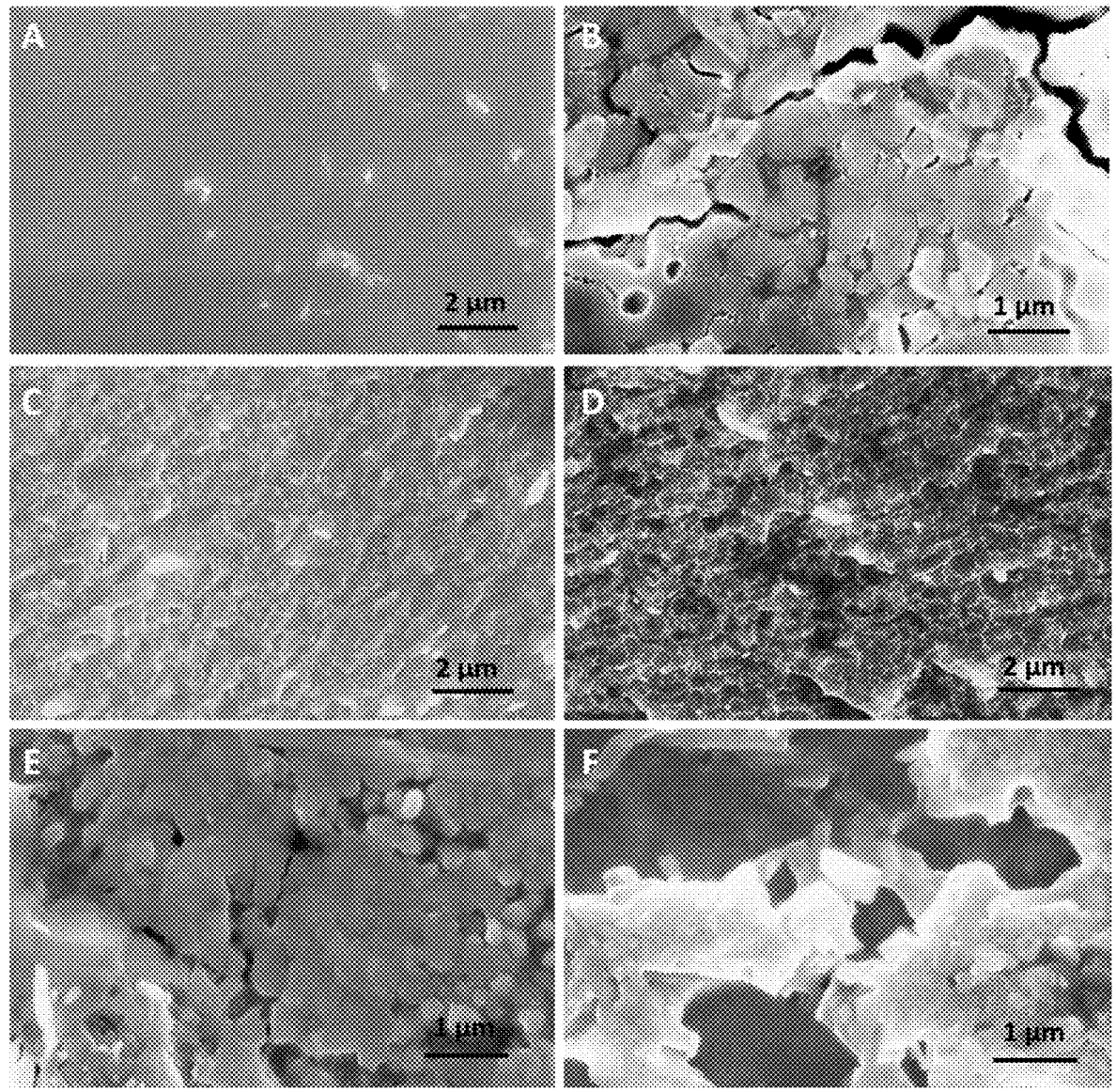
FIG. 20 illustrates SEM images of the bottom and top fracture surfaces resulting from the delamination tests, according to some embodiments of the present disclosure. Three types of samples are shown: (Panels A, B) pristine; (Panels C, D) with SnF$_2$·3FACl (5 mol %) additive; (Panels E, F) with SnCl$_2$·3FACl (5 mol %) additive.

To elucidate the possible mechanisms responsible for the low residual stresses due to the $SnCl_2 \cdot 3FACl$ additive mechanical delamination tests were performed. Residual stresses in perovskite films typically develop when the perovskite phase crystallizes from the as-spun film during the thermal annealing process, where the perovskite film attaches to the substrate at high temperatures and is subsequently cooled down. The significantly higher CTE of perovskite compared to that of glass results in the tensile nature of the residual stresses in the film after cooling (see FIG. 17D). It was determined that the pure perovskite phase formed immediately after the spin-coating process (without heat-treatment) both without and with the $SnCl_2 \cdot 3FACl$ additive (see FIG. 19). However, the structural integrity of the perovskite-substrate interface during this stage is strikingly different. In the additive-free case, it is found that the delamination occurs primarily at the perovskite-substrate interface, whereas the film fractures within the bulk film in the $SnCl_2 \cdot 3FACl$ additive case (see FIG. 20). This indicates that the $SnCl_2 \cdot 3FACl$ additive promotes the bonding between the perovskite film and the substrate before heating, reducing the development of residual stresses upon the subsequent heating-cooling cycle. This proposed mechanism is illustrated schematically in FIG. 17D.

Figure 21A:
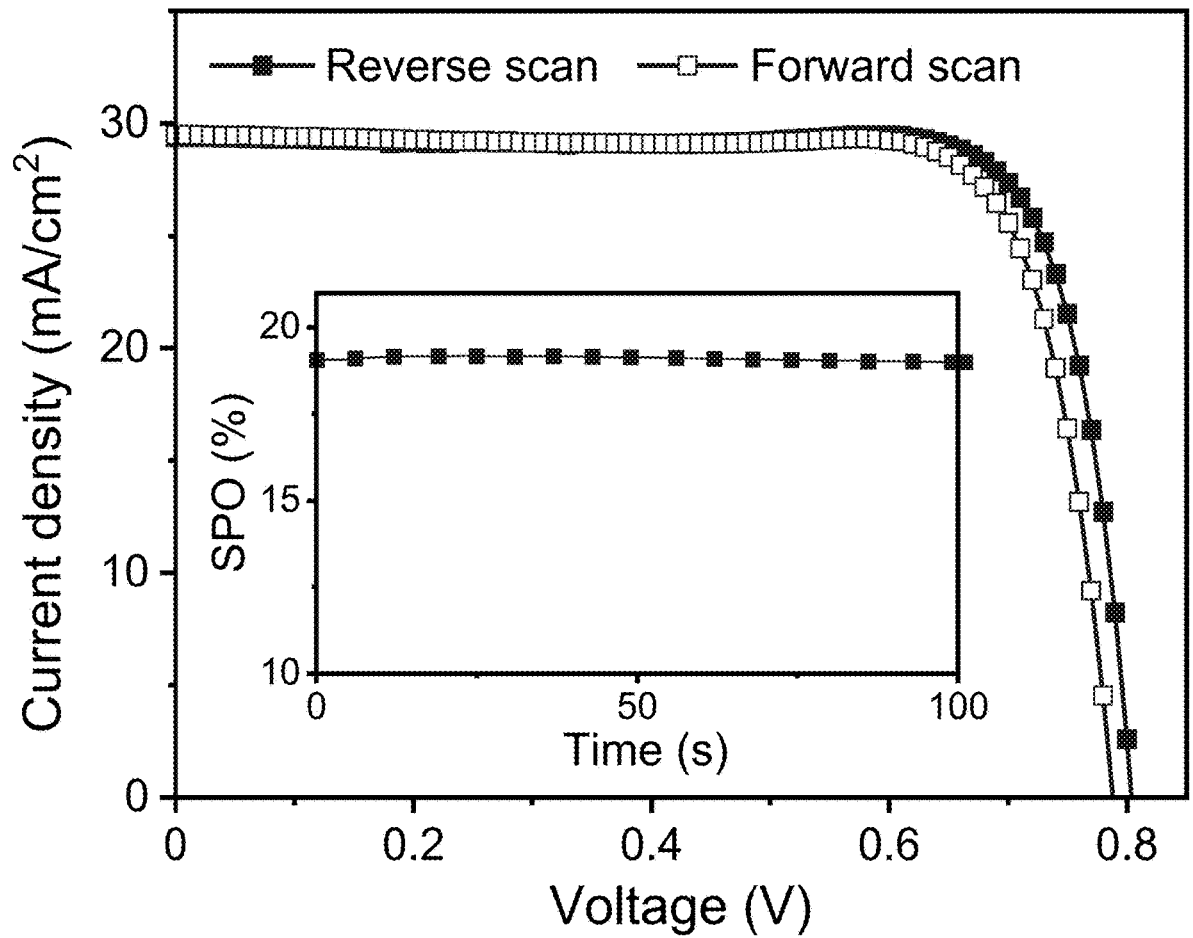
FIG. 21A illustrates J-V curves (insets: corresponding SPOs) under 1-sun illumination of the Cs$_{0.3}$FA$_{0.7}$Sn$_{0.3}$Pb$_{0.7}$I$_3$-based champion PSC made with the SnCl$_2$·3FACl additive (5 mol %), according to some embodiments of the present disclosure.
Figure 21B:
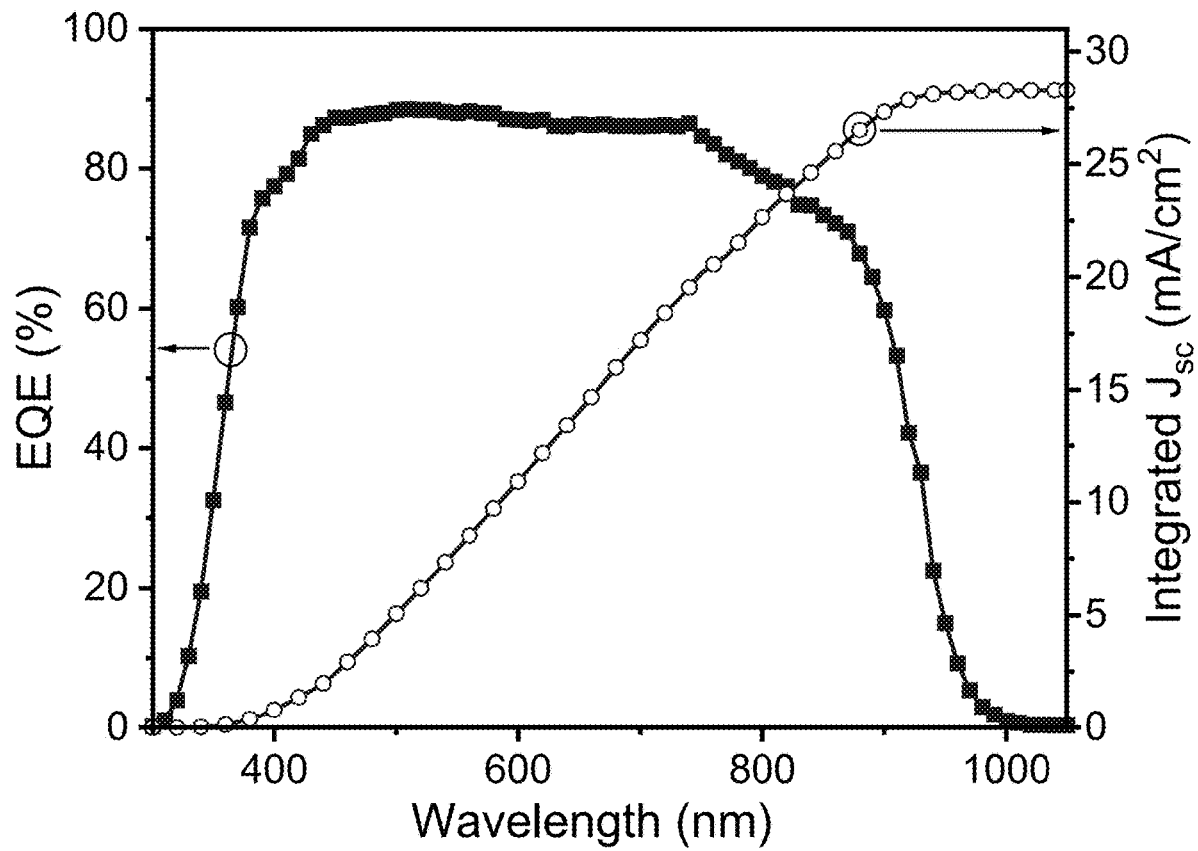
FIG. 21B illustrates EQE spectra of the Cs$_{0.3}$FA$_{0.7}$Sn$_{0.3}$Pb$_{0.7}$I$_3$-based champion PSC made with the SnCl$_2$·3FACl additive (5 mol %), according to some embodiments of the present disclosure.
Figure 21C:
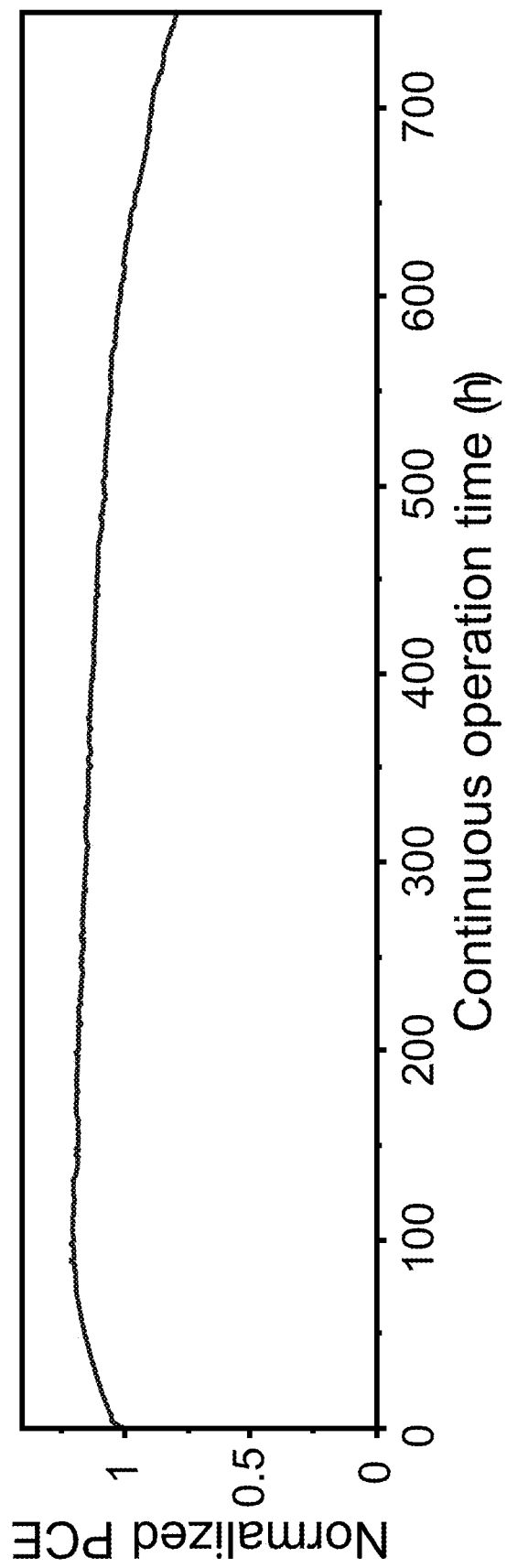
FIG. 21C illustrates MPP tracking of Cs$_{0.3}$FA$_{0.7}$Sn$_{0.3}$Pb$_{0.7}$I$_3$ PSC made with the SnCl$_2$·3FACl additive, under continuous 1-sun illumination, at about 45° C., in nitrogen atmosphere, according to some embodiments of the present disclosure.
Figure 22:
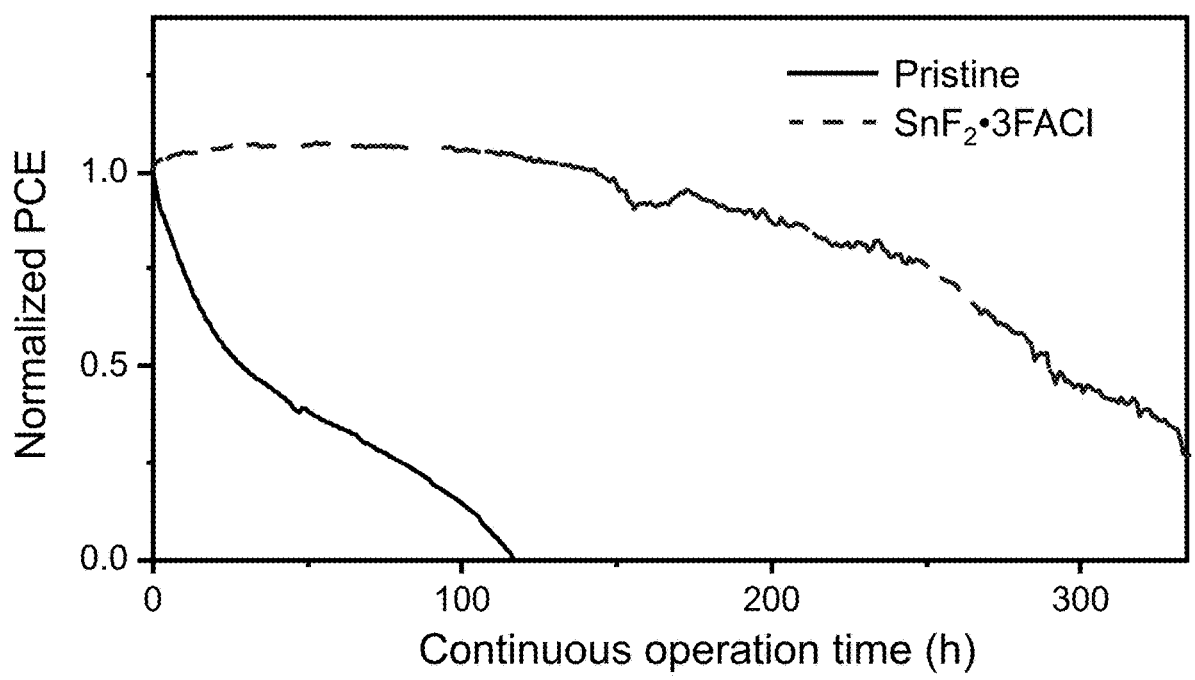
FIG. 22 illustrates MPP tracking of Cs$_{0.3}$FA$_{0.7}$Sn$_{0.3}$Pb$_{0.7}$I$_3$ PSCs made with SnF$_2$·3FACl additive and without (pristine), under continuous 1-sun intensity illumination, at about 45° C., in nitrogen atmosphere, according to some embodiments of the present disclosure.

Composition-specific performance and stabilities of Sn—Pb PSCs with $SnCl_2 \cdot 3FACl$ additives. FIG. 21A shows the J-V curves of the champion device based on $Cs_{0.3}FA_{0.7}Sn_{0.3}Pb_{0.7}I_3$ using the additive $SnCl_2 \cdot xFACl$ (x=3). It shows a PCE of 19.3% in reverse scan, 18.5% in forward scan, and SPO efficiency of 19.1% (see FIG. 21A, inset). The detailed PV parameters are shown in Table 3. The EQE spectra along with the integrated $J_{SC}$ are shown FIG. 21B, where the latter is 28.3 $mA/cm^2$, which is within 3%$^{-4}$% of the J-V measurement. To test the impact of the $SnCl_2 \cdot 3FACl$ additive on the device stability, the continuous operation (see FIG. 21C) with maximum-power-point (MPP) tracking of unencapsulated $Cs_{0.3}FA_{0.7}Sn_{0.3}Pb_{0.7}I_3$ devices under 1-sun illumination was evaluated, in nitrogen atmosphere, with ambient temperature of about 45° C. (ISOS-L-1 stability). A comparison of the pristine device to the $SnF_2 \cdot 3FACl$-additive-based device (see FIG. 22) illustrates that the $SnCl_2 \cdot 3FACl$-additive-based device showed much improved operational stability with a T80 of about 750 hours, where T80 refers to the duration at 80% retention of the initial PCE. This continuous 1-sun operation stability is approaching that for PSCs based on Pb-only, and it represents the best reported operational stability for high-efficiency (19-20%) Sn—Pb ideal-bandgap PSCs. It is worth pointing out that the T90 is ~690 hours in FIG. 21C. The observed increasing degradation rate starting at ~650 hours is likely associated with the use of the Ag contact, which can migrate to induce degradation. PEDOT:PSS is also known to cause device degradation in Sn—Pb PSCs. Thus, contact layer optimization strategies are expected to further increase the device stability in the future.

TABLE 3

J-V parameters of champion perovskite solar cells based on $Cs_{0.3}FA_{0.7}Sn_{0.3}Pb_{0.7}I_3$ and $Cs_{0.1}FA_{0.9}Sn_{0.3}Pb_{0.7}I_3$ perovskite films made with $SnCl_2 \cdot 3FACl$ (5 mol %) additive.

| Device | | $J_{sc}$ ($mA/cm^2$) | $V_{oc}$ (V) | FF (%) | PCE (%) | SPO (%) |
|---|---|---|---|---|---|---|
| $Cs_{0.3}FA_{0.7}Sn_{0.3}Pb_{0.7}I_3$ | Reverse | 29.4 | 0.804 | 81.8 | 19.3 | 19.1 |
| | Forward | 29.5 | 0.788 | 79.7 | 18.5 | |
| $Cs_{0.1}FA_{0.9}Sn_{0.3}Pb_{0.7}I_3$ | Reverse | 30.2 | 0.825 | 80.1 | 20.0 | 19.5 |
| | Forward | 30.1 | 0.823 | 78.8 | 19.5 | |

Figure 23:
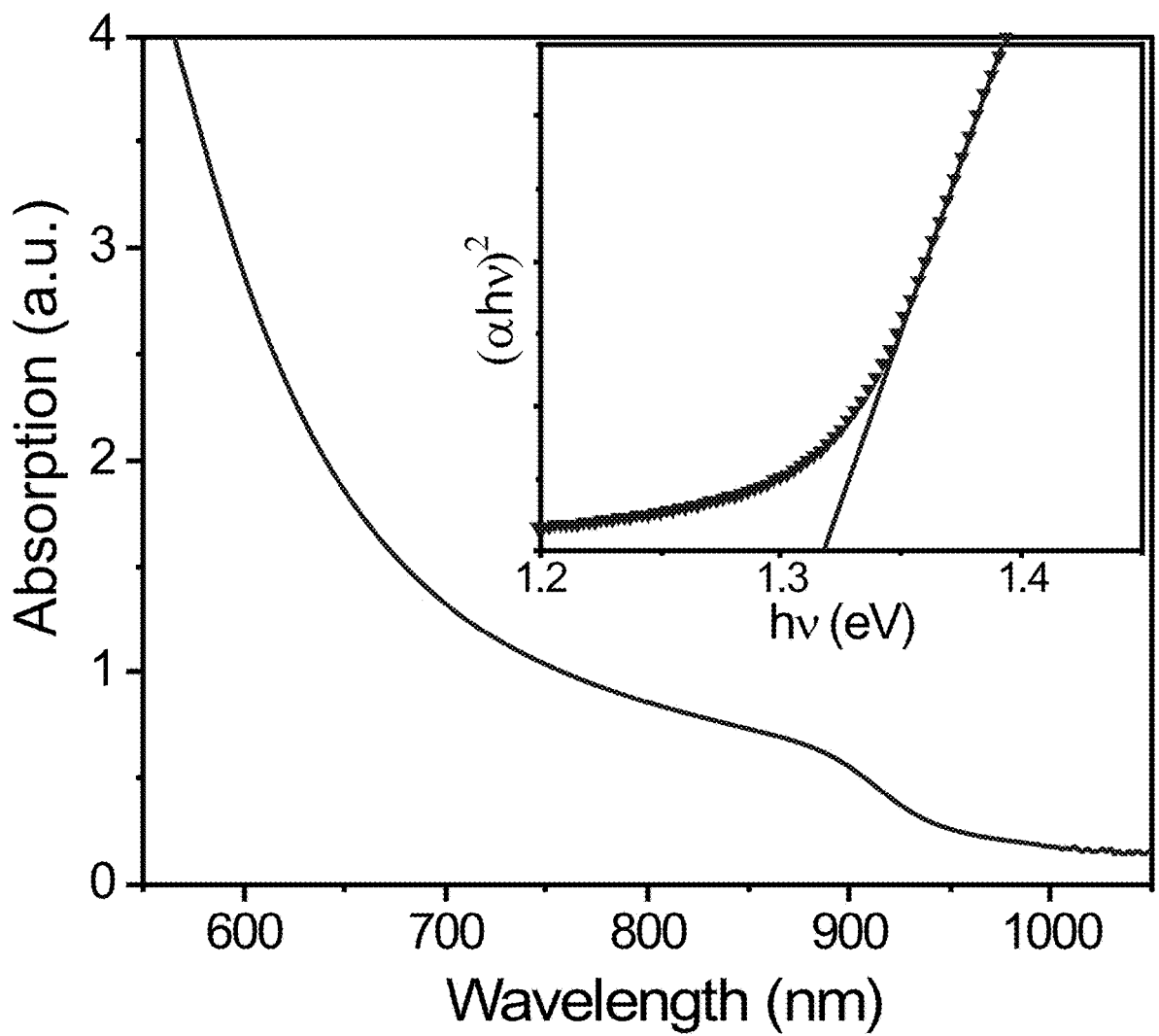
FIG. 23 illustrates UV-vis absorption spectrum and the corresponding Tauc plot (inset) of Cs$_{0.1}$FA$_{0.9}$Sn$_{0.3}$Pb$_{0.7}$I$_3$ perovskite thin film prepared with SnCl$_2$·3FACl (5 mol %) additive, according to some embodiments of the present disclosure. The bandgap is ~1.32 eV.
Figure 24A:
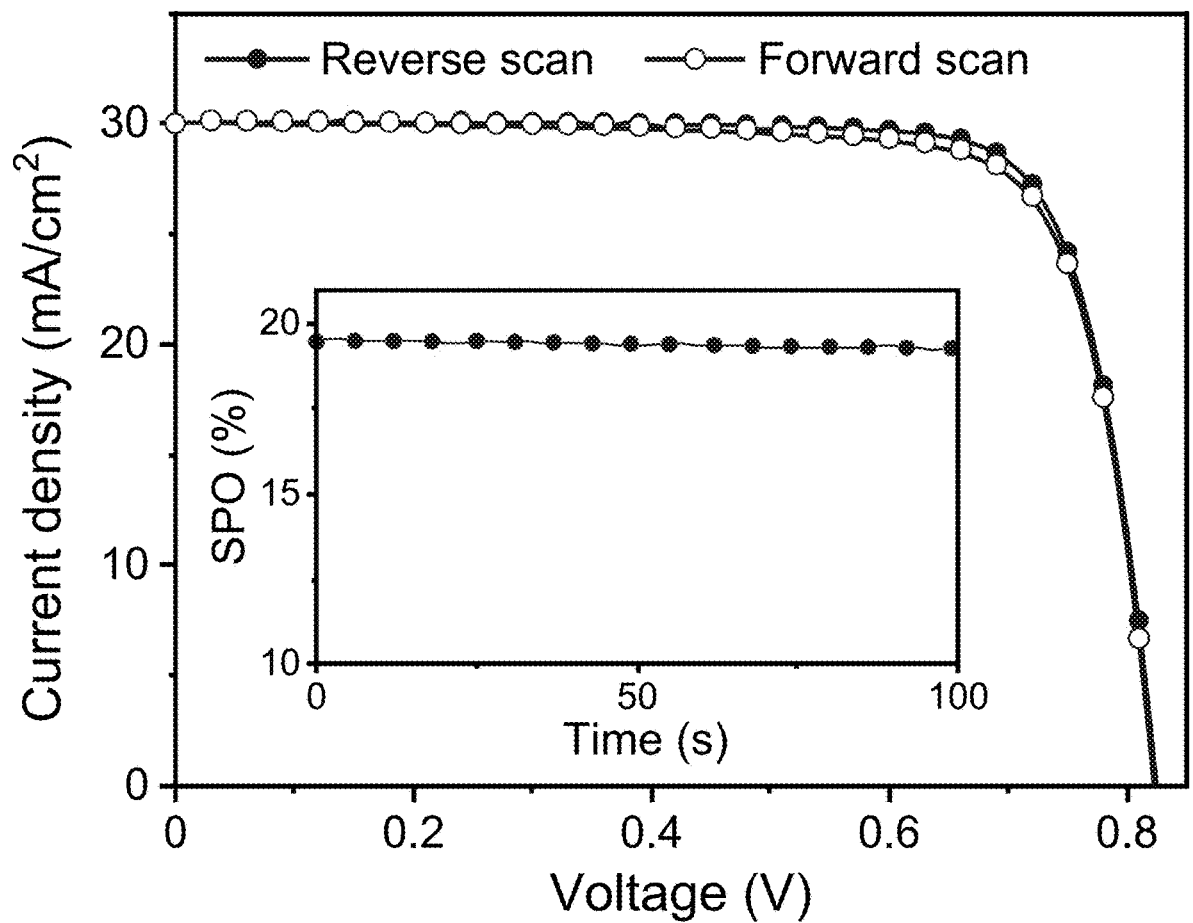
FIG. 24A illustrates a J-V curve (insets: corresponding SPOs) under 1-sun illumination for a Cs$_{0.1}$FA$_{0.9}$Sn$_{0.3}$Pb$_{0.7}$I$_3$ based perovskite solar cell made with the SnCl$_2$·3FACl additive (5 mol %), according to some embodiments of the present disclosure.
Figure 24B:
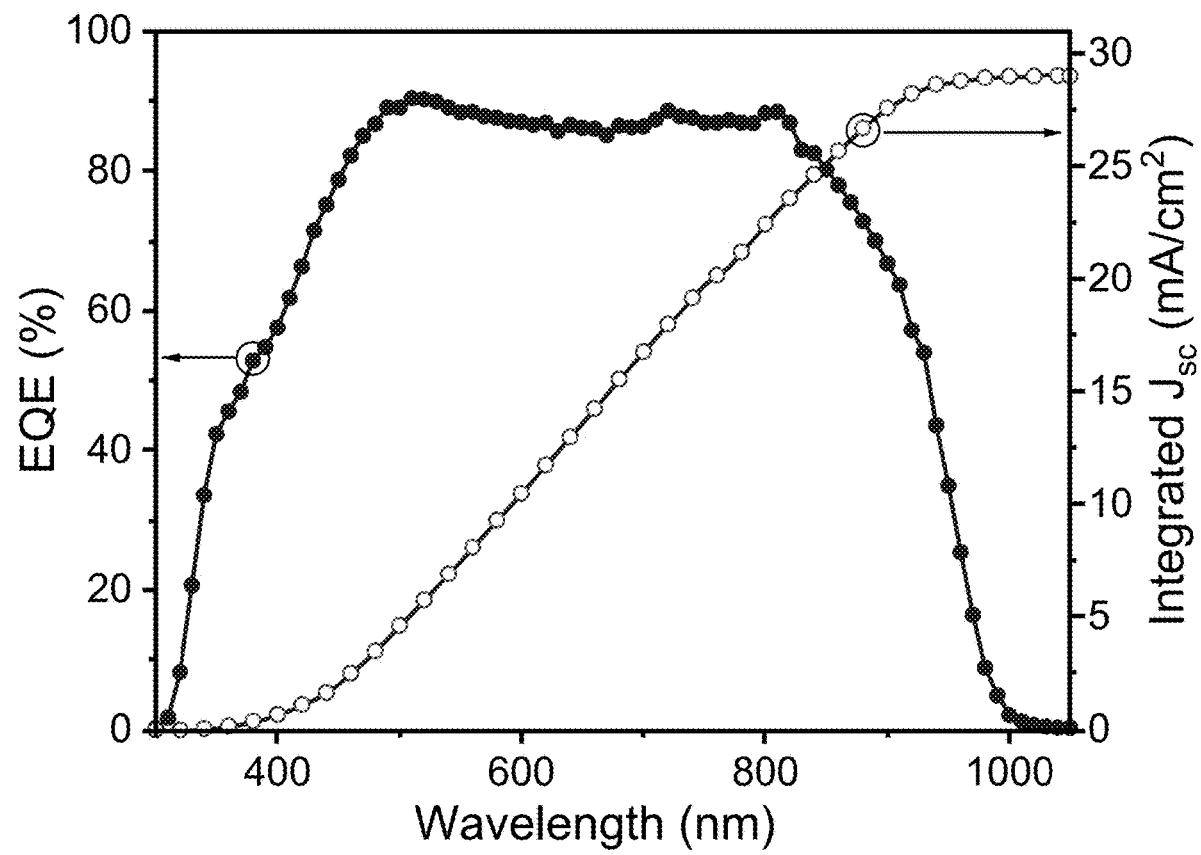
FIG. 24B illustrates EQE spectra of the Cs$_{0.1}$FA$_{0.9}$Sn$_{0.3}$Pb$_{0.7}$I$_3$ PSC made with the SnCl$_2$·3FACl additive (5 mol %), according to some embodiments of the present disclosure.
Figure 24C:
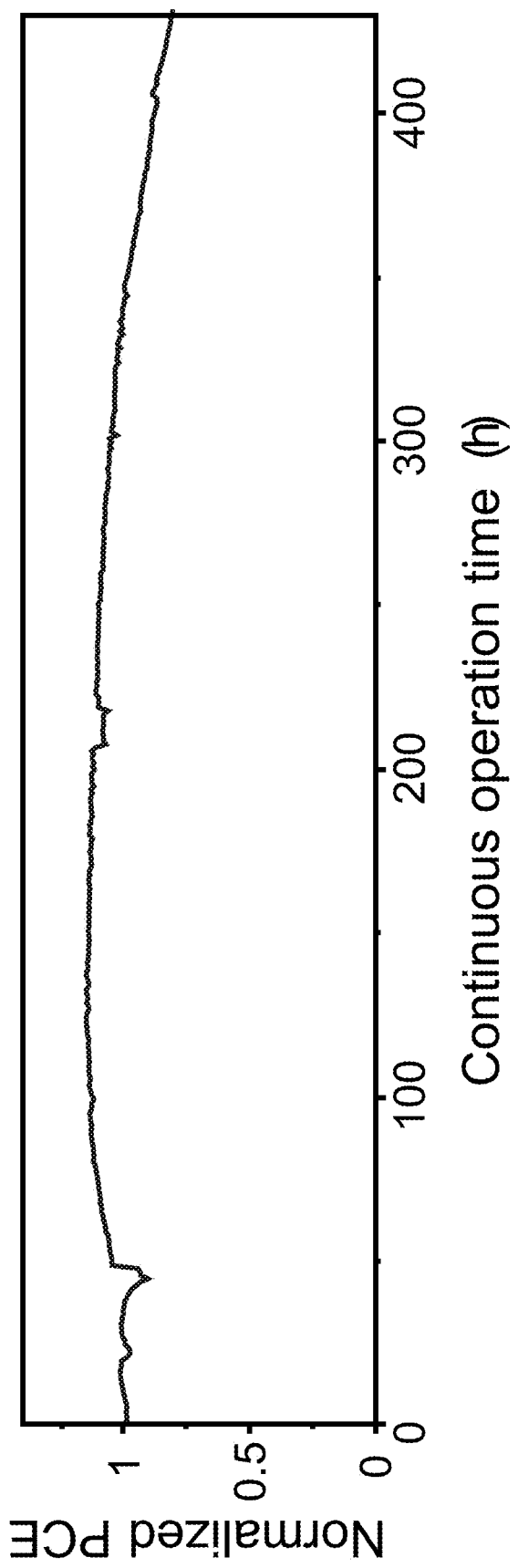
FIG. 24C illustrates MPP tracking results measured under continuous 1-sun intensity illumination, at about 45° C. of the Cs$_{0.1}$FA$_{0.9}$Sn$_{0.3}$Pb$_{0.7}$I$_3$ PSC made with the SnCl$_2$.3FACl additive (5 mol %), in a nitrogen atmosphere, according to some in the present disclosure.

Finally, the effect of tuning the cesium content on device performance was tested. By reducing the cesium content to 10%, the resulting perovskite $Cs_{0.1}FA_{0.9}Sn_{0.3}Pb_{0.7}I_3$ had a bandgap of ~1.32 eV (see FIG. 23), which is also near the ideal bandgap (~1.34 eV) for single-junction devices. FIGS. 24A, 24B, and 24C illustrate the device characteristics of the champion $Cs_{0.1}FA_{0.9}Sn_{0.3}Pb_{0.7}I_3$ device by using the $SnCl_2 \cdot 3FACl$ additive (5 mol %). The device efficiency was slightly higher (SPO=19.5%; Table 3), but the stability was slightly reduced to a T80 of ~430 hours, compared to $Cs_{0.3}FA_{0.7}Sn_{0.3}Pb_{0.7}I_3$ devices. These results suggest that adjusting/improving Sn—Pb perovskite absorber layer is important for enhancing Sn—Pb perovskite device efficiency and stability. These results also indicate the importance of not only improving the thin-film microstructure but also reducing residual stresses in Sn—Pb film when developing Sn—Pb-based ideal-bandgap PSCs having simultaneously high PCE and long operational stability.

Perovskite Precursor Preparation

All the perovskite solution and films depositions were conducted in a $N_2$ glovebox with $O_2$ level<1 ppm, $H_2O$<1 ppm. A "baseline" perovskite, $Cs_{0.3}FA_{0.7}Sn_{0.3}Pb_{0.7}I_3$, was prepared by making a solution by mixing 76.1 mg FAI (Greatcell, Australia), 203.9 mg $PbI_2$ (anhydrous, Sigma-Aldrich, USA), 49.3 mg CsI (anhydrous, Sigma-Aldrich, USA), and 70.7 mg $SnI_2$ (anhydrous, bead, Sigma-Aldrich, USA) in 263 µl DMF (anhydrous, Sigma-Aldrich, USA) and 88 µl DMSO (anhydrous, Sigma-Aldrich). For preparing $SnF_2 \cdot 3FACl$ or $SnCl_2 \cdot 3FACl$ additives, $SnF_2$ (Sigma-Aldrich, USA) or $SnCl_2$ (Sigma-Aldrich, USA) were mixed with FACl powders in a molar ratio of 1:3 in a DMF solvent, followed by a drying process using rotary evaporator. The $SnF_2 \cdot 3FACl$ or $SnCl_2 \cdot 3FACl$ additives were added to the perovskite precursor with different molar ratios relative to the $SnI_2$ molar amounts. For example, the precursor with 5 mol % $SnCl_2 \cdot 3FACl$ additive was prepared by adding 4.1 mg $SnCl_2 \cdot 3FACl$ into the abovementioned baseline perovskite precursor solution.

Device Fabrication

The prepatterned ITO substrates were sequentially cleaned three times by ultrasonication in acetone and isopropanol (a first treatment in a first mixture of acetone, followed by a second treatment in a second mixture of IPA, this sequence repeated three times). The ITO/glass substrates were then dried with $N_2$ gun and UV-ozone treated for 15 minutes. The PEDOT:PSS (CLEVIOS™ P VP Al 4083, filtered through a 0.45 µm Nylon filter) were spin coated onto ITO substrates at 3000 rpm for 30 seconds and annealed on a hot plate at 150° C. for 30 minutes in air. After that, the substrates were transferred to a nitrogen glovebox $O_2$ level<1 ppm, $H_2O$<1 ppm) to prepare the $Cs_{0.3}FA_{0.7}Sn_{0.3}Pb_{0.7}I_3$. The perovskite films were deposited by spin-coating the solution as described above at 5000 rpm for 60 s. $N_2$ stream was blown over the spinning substrate for 30 s during the spinning procedure to assist the formation of perovskite film. Films were then annealed at 150° C. for 15 minutes. Finally, C60 (25 nm)/Bathocuproine (6 nm)/Ag (120 nm) were sequentially deposited by thermal evaporation to complete the PSC devices.

Materials Characterization

X-ray diffraction (XRD) was performed using an X-ray diffractometer (D-8 Discover, Bruker, Germany) with Cu Kα1 radiation (λ=1.5406 Å) at a step size of 0.02°. XRD patterns for the confirmation of the perovskite phase were collected using a Ge (002) monochromete, at a step time of 2 s. Diffraction patterns were collected as a function of θ angle of the film, using two different orthogonal orientations (φ=0° and 90°) for confirming the isotropic nature of the residue stresses. The d-spacings (220) for the well-defined XRD peaks at the highest 2q angle (~40.6°) were used to generate the $sin^2\psi$ plots. Time-integrated photoluminescence spectra were excited at 405 nm and measured with a CCD camera. X-ray photoelectron spectroscopy (XPS) was performed with a Kratos Axis Ultra X-ray photoelectron spectrometer with a monochromatic Al Kα source (1486.6 eV) at a base pressure of $10^{-9}$ Torr. Photoelectrons were collected in a hemispherical analyzer and detected with a photodiode array. A 20-eV pass energy was used for all element specific spectral acquisitions. Resulting XPS spectra were first baseline corrected using linear subtraction methods for acquired Sn3d, Cl2p, and F1s spectra, and with Shirley baseline corrections for Pb4f, Cs3d, N1s, and I3d spectra. The Sn3d spectra were fit using a 30% Gaussian, 70% Lorentzian peak shape, with spin orbit coupling constrained using energetic separations of 8.4 eV, peak ratios of 3:2 ($Sn3d_{5/2}$:$Sn3d_{3/2}$), and equivalent FWHMs with an average of 1.03 eV±0.11 eV between samples.

SEM and Optical Absorbance

The morphologies and microstructures of the prepared perovskite films and the cross-sectional structures and thickness of the solar cells were investigated using a field-emission scanning electron microscopy (FESEM, Nova 630 NanoSEM, FEI). The optical absorbance spectra of perovskite films were measured using an ultraviolet-visible (UV-vis) spectrophotometer (Cary-6000i, Agilent).

Delamination Experiments

For the delamination test, the as-deposited $Cs_{0.3}FA_{0.7}Sn_{0.3}Pb_{0.7}I_3$ films were coated with thin layer (~160 nm) of polymethylmethacrylate (PMMA) for protection by spin-coating 50 μL of a 10 wt % PMMA (Sigma-Aldrich, USA) solution in chlorobenzene at 4000 rpm for 30 s. Subsequently, A thin layer of epoxy (Hysol, USA) was then applied onto the PMMA layer to 'glue' another cleaned glass substrate on top. The 'sandwich' specimens were then cured in a $N_2$-filled glovebox for 12 h, and the excess epoxy at the edges was cleaned off with a razor blade. Then, A planar crack was introduced and propagated by inserting a razor blade 'wedge' into the 'sandwich' specimen slowly until the full delamination is achieved. The two mating fracture surfaces were observed using scanning electron microscope (LEO 1530 VP, Zeiss, Germany).

Estimation of $E_{<220>}$

The following approach is used to arrive at a reasonable estimate. The Youngs' modulus, E, of $FAPbI_3$ is assumed to be ~17.8 GPa[34] and that of $CsSnI_3$ to be ~20.2 GPa.[35] Since these E values are reasonably close, the rule-of-mixtures approximation is used to calculate an E~18.5 GPa for the $Cs_{0.3}FA_{0.7}Sn_{0.3}Pb_{0.7}I_3$ solid-solution perovskite. Since E of halide perovskites are not very anisotropic,[26,28] the average E~18.5 GPa is used in Eqn. 1 in lieu of $E_{<220>}$.

Device Characterization

Devices were tested using a Newport Oriel Sol3A solar simulator with a xenon lamp inside a nitrogen glove box. The intensity of the solar simulator was calibrated using $J_{sc}$ produced in a certified KG2-filtered silicon photodiode. By measuring the external quantum efficiency curve of the solar cell (conducted on a Newport system in ambient air), the spectral mismatch factor was calculated and used to appropriately adjust the intensity of the solar simulator lamp to provide 1-sun illumination. Through this procedure, we verified that the $J_{sc}$ measured corresponded correctly to that the solar cells generated under AM1.5G solar illumination. The light current density-voltage (J-V) characteristic were taken from both forward bias to reverse bias and reverse bias to forward bias, with the step size of 10 mV and step delay of 10 ms, unless otherwise stated. The device area was 0.1 $cm^2$ and was masked with a metal aperture to define an active area of 0.058 $cm^2$. The stable power output (SPO) of the devices was measured by monitoring the photocurrent current density output with the biased voltage set near the maximum power point. External quantum efficiency (EQE) measurements were taken using a Newport Oriel IQE200.

Stability Testing

For device operational stability test, PSCs were placed in a sealed cell holder with a transparent quartz cover. A continuous flow of $N_2$ gas was passed through the holder to minimize the water and oxygen content in the atmosphere. J-V curves were performed every hour. The temperature of the devices was maintained at ~45° C. under continuous one-sun-intensity white-LED illumination. Between the J-V measurements, the PSCs were biased at the maximum-power-point voltage using a potentiostat under illumination.

Conductive Atomic Force Microscope (AFM)

The Conductive-AFM measurements were performed on a Bruker Icon AFM system in Ar-filled glovebox. A Pt—Ir coated tip (Nanosensor PPP-EFM) scans in contact mode, where the tip virtually grounded, and a 600-mV bias voltage was applied to the sample. The scans were in 2×2 $\mu m^2$, with 1024 points in the fast-scan axis and 256 lines in the slow-scan axis. The mappings were done at least on 3 random locations to ensure reliable results. Note that the experiments were done within a few hours after film deposition.

Field-Effect Transistor (FET) and IV Measurement

FET device fabrication. The typical device was fabricated on the 200 nm thickness $SiO_2$/highly doped Si wafer (1-10 $\Omega cm^{-1}$) purchased from MTI corporation by using the standard optical lithography technique, and then the 5 nm thickness Ti/20 nm thickness Au electrodes were deposited on the patterned sample by using the thermal evaporation deposition system, and the gate electrode was directly contacted with highly doped Si wafer, all the procedures were performed in the cleanroom. The designed channel lengths ($L_{ch}$) of the typical device is 10 μm and the channel width ($W_{ch}$) is 1000 μm. The perovskite films were then prepared by spin coating the precursor solution on to the prefabricated device by using a spin-rate of 3000 rpm for 30 s, followed by annealing at 150° C. for 30 min on the hotplate in the Nitrogen-filled glovebox.

FET and IV measurement. The standard FET measurement was performed inside the $N_2$ filled glovebox by using two Keithley 2400 source meters with LabVIEW control program. One sourcemeter was used to supply the source-drain voltage (VDS) and monitor the channel current (IDS), the other sourcemeter was used to supply the gate voltage (VGS) and monitor the gate leakage current. And the standard IV measurement was performed by using one Keithley 2400 sourcemeter with LabVIEW control program.

EXAMPLES

Example 1. A composition comprising: a perovskite having a stoichiometry comprising $A_{1-x}FA_xSn_{1-y}B_y(I_{1-z}X_z)_3$, wherein: A is a first cation, B is a second cation, X is a halide, and $0.5 < x \le 0.9$, $0.5 \le y \le 0.9$, and $0 \le z \le 1$.

Example 2. The composition of Example 1, wherein A comprises at least one of cesium, guanidinium, or methylammonium.

Example 3. The composition of either Example 1 or Example 2, wherein X comprises at least one of bromide or chloride.

Example 4. The composition of any one of Examples 1-3, wherein z equals zero.

Example 5. The composition of any one of Examples 1-4, further comprising a bandgap between about 1.1 eV and about 1.5 eV.

Example 6. The composition of any one of Examples 1-5, wherein the bandgap is between about 1.3 eV and about 1.4 eV.

Example 7. The composition of any one of Examples 1-6, wherein the composition further comprises at least one physical property with a characteristic value.

Example 8. The composition of any one of Examples 1-7, wherein the physical property comprises a grain size with the characteristic value between about 300 nm and about 1500 nm.

Example 9. The composition of any one of Examples 1-8, wherein the grain size is between about 750 nm and about 850 nm.

Example 10. The composition of any one of Examples 1-9, wherein the physical property comprises a biaxial residual stress level with the characteristic value between about 0 MPa and about 100 MPa.

Example 11. The composition of any one of Examples 1-10, wherein the biaxial residual stress level is between about 0 MPa and about 40 MPa.

Example 12. The composition of any one of Examples 1-11, wherein the physical property comprises a dark carrier density with the characteristic value between about $1 \times 10^{13}$ cm$^{-3}$ and about $1 \times 10^{17}$ cm$^{-3}$.

Example 13. The composition of any one of Examples 1-12, wherein the dark carrier density is between about $5 \times 10^{14}$ cm$^{-3}$ and about $5 \times 10^{16}$ cm$^{-3}$.

Example 14. The composition of any one of Examples 1-13, comprising $Cs_{1-x}FA_xSn_{1-y}Pb_yI_3$.

Example 15. The composition of any one of Examples 1-14, wherein $0.6 \le x \le 0.8$ and $0.6 \le y \le 0.8$.

Example 16. A method of making a perovskite, the method comprising: combining a stoichiometric amount of at least one perovskite precursor comprising formamidinium (FA), tin, iodide, A, B, and X resulting in a mixture; adding an additive to the mixture; and treating the mixture, wherein: the treating results in the forming of the perovskite having a stoichiometry comprising $A_{1-x}FA_xSn_{1-y}B_y(I_{1-z}X_z)_3$, A is a first cation, B is a second cation, X is a halide, $0 \le x \le 1$, $0 \le y \le 1$, $0 \le z \le 1$, and the additive comprises FA and tin and at least one of fluoride or chloride.

Example 17. The method of Example 16, wherein the additive is added at a concentration between about 0.1 mol % and about 10 mol % relative to the stoichiometric amount.

Example 18. The method of either Example 16 or Example 17, wherein the concentration is between about 0.1 mol % and about 5 mol %.

Example 19. The method of any one of Examples 16-18, wherein the mixture is substantially in a liquid phase.

Example 20. The method of any one of Examples 16-19, wherein the mixture is substantially in a solid phase Example 21. The method of any one of Examples 16-20, wherein the mixture is substantially in a gas phase.

Example 22. The method of any one of Examples 16-21, wherein the mixture includes a solvent.

Example 23. The method of any one of Examples 16-22, wherein the solvent includes at least one of dimethylformamide, dimethyl sulfoxide, N-methyl-2-pyrrolidone, gamma-butyrolactone, acetonitrile, 2-methoxyethanol, or N,N-dimethylacetamide.

Example 24. The method of any one of Examples 16-23, wherein: the additive comprises at least one of $SnF_{2-x}FACl$ or $SnCl_{2-x}FACl$, and $1.5 \le x \le 4.5$.

Example 25. The method of any one of Examples 16-24, wherein $2.5 \le x \le 3.5$.

Example 26. The method of any one of Examples 16-25, wherein: the at least one perovskite precursor comprises $SnI_2$, and the additive is present at a molar ratio between about 0.1% and about 10% or between about 3% and about 6% (optimum about 5%) relative to the amount of $SnI_2$.

Example 27. The method of any one of Examples 16-26, wherein at least one of the combining or adding are performed at a first temperature between about 20° C. and about 50° C.

Example 28. The method of any one of Examples 16-27, wherein the treating comprises exposing the mixture to at least one of heat or vacuum.

Example 29. The method of any one of Examples 16-28, wherein the treating is performed at a second temperature between about 100° C. and about 180° C.

Example 30. The method of any one of Examples 16-29, wherein the second temperature is between about 100° C. and about 150° C.

Example 31. The method of any one of Examples 16-30, wherein the second temperature is between about 130° C. and about 150° C.

Example 32. The method of any one of Examples 16-31, wherein treating is performed at an absolute pressure between about 0.1 atm and about 1.1 atm.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A composition comprising:
a perovskite layer having a stoichiometry comprising $Cs_{1-x}FA_xSn_{1-y}Pb_y(I_{1-z}X_z)_3$, wherein:
the perovskite layer has an average grain size of 865 nm±360 nm,
X is a halide,
$0.5 \leq x \leq 0.9$, $0.5 \leq y \leq 0.9$, and $0 \leq z \leq 1$.

2. The composition of claim 1, wherein X comprises at least one of bromide or chloride.

3. The composition of claim 1, wherein z equals zero.

4. The composition of claim 1, further comprising a bandgap between about 1.1 eV and about 1.5 eV.

5. The composition of claim 4, wherein the bandgap is between about 1.3 eV and about 1.4 eV.

6. The composition of claim 1, further comprising a biaxial residual stress level between about 0 MPa and about 100 MPa.

7. The composition of claim 6, wherein the biaxial residual stress level is between about 0 MPa and about 40 MPa.

8. The composition of claim 1, further comprising a dark carrier density between about $1 \times 10^{13}$ cm$^{-3}$ and about $1 \times 10^{17}$ cm$^{-3}$.

9. The composition of claim 8, wherein the dark carrier density is between about $5 \times 10^{14}$ cm$^{-3}$ and about $5 \times 10^{16}$ cm$^{-3}$.

10. The composition of claim 1, wherein the stoichiometry comprises $Cs_{1-x}FA_xSn_{1-y}Pb_yI_3$.

11. The composition of claim 10, wherein $0.6 \leq x \leq 0.8$ and $0.6 \leq y \leq 0.8$.

12. A method of making a perovskite, the method comprising:
combining a stoichiometric amount of at least one perovskite precursor comprising cesium, formamidinium (FA), tin, and at least one of iodide or X resulting in a mixture;
adding an additive to the mixture; and
treating the mixture, wherein:
the treating results in forming a perovskite layer having a stoichiometry comprising $Cs_{1-x}FA_xSn_{1-y}Pb_y(I_{1-z}X_z)_3$,
the perovskite layer has an average grain size of 865 nm±360 nm,
X is a halide other than iodide,
$0.5 \leq x \leq 0.9$, $0.5 \leq y \leq 1$, 0.9, $0 \leq z \leq 1$, and
the additive comprises FA and tin and at least one of fluoride or chloride.

13. The method of claim 12, wherein the additive is added at a concentration between about 0.1 mol % and about 10 mol % relative to the stoichiometric amount.

14. The method of claim 13, wherein the concentration is between about 0.1 mol % and about 5 mol %.

15. The method of claim 12, wherein:
the additive comprises at least one of $SnF_2 \cdot nFACl$ or $SnCl_2 \cdot nFACl$.

16. The method of claim 15, wherein $2.5 \leq n \leq 3.5$.

17. The composition of claim 1, wherein the perovskite layer has a grain boundary width less than 45 nm.

18. The composition of claim 17, wherein the perovskite layer has less than 3 grains/$\mu m^2$.

19. The method of claim 12, wherein the perovskite layer has a grain boundary width less than 45 nm.

20. The method of claim 19, wherein the perovskite layer has less than 3 grains/$\mu m^2$.

* * * * *